(12) United States Patent
Miller et al.

(10) Patent No.: US 6,856,068 B2
(45) Date of Patent: Feb. 15, 2005

(54) SYSTEMS AND METHODS FOR OVERCOMING STICTION

(75) Inventors: David Miller, Louisville, CO (US); Lilac Muller, Nederland, CO (US); Robert L. Anderson, Boulder, CO (US)

(73) Assignee: PTS Corporation, San Jose, CA (US)

( * ) Notice: Subject to any disclaimer, the term of this patent is extended or adjusted under 35 U.S.C. 154(b) by 153 days.

(21) Appl. No.: 10/087,040

(22) Filed: Feb. 28, 2002

(65) Prior Publication Data

US 2003/0160540 A1 Aug. 28, 2003

(51) Int. Cl.$^7$ ................................. H02N 2/00
(52) U.S. Cl. ..................... 310/311; 310/309; 310/328; 385/18; 359/225
(58) Field of Search ................. 310/309, 311, 310/328; 359/291, 225, 295; 385/18; 335/79

(56) References Cited

U.S. PATENT DOCUMENTS

| | | | | |
|---|---|---|---|---|
| 4,668,928 A | * | 5/1987 | Davis et al. | 335/79 |
| 5,414,540 A | | 5/1995 | Patel et al. | 359/39 |
| 5,917,625 A | | 6/1999 | Ogusu et al. | 359/130 |
| 5,999,672 A | | 12/1999 | Hunter et al. | 385/37 |
| 6,028,689 A | | 2/2000 | Michalicek et al. | 359/224 |
| 6,040,611 A | * | 3/2000 | De Los Santos et al. | 257/415 |
| 6,040,935 A | | 3/2000 | Michalicek | 359/198 |
| 6,046,840 A | * | 4/2000 | Huibers | 359/291 |
| 6,097,859 A | | 8/2000 | Solgaard' | 385/17 |
| 6,108,471 A | | 8/2000 | Zhang et al. | 385/37 |
| 6,128,122 A | | 10/2000 | Drake et al. | 359/224 |
| 6,160,683 A | * | 12/2000 | Boutaghou | 360/237.1 |
| 6,535,319 B2 | * | 3/2003 | Buzzetta et al. | 359/225 |
| 6,614,581 B2 | * | 9/2003 | Anderson | 359/295 |
| 6,625,342 B2 | * | 9/2003 | Staple et al. | 385/18 |
| 6,701,037 B2 | * | 3/2004 | Staple et al. | 385/18 |

OTHER PUBLICATIONS

U.S. patent application Ser. No. 09/442,061, Weverka et al., filed Nov. 16, 1999.
T. Akiyama, et al.; "Controlled Stepwise Motion in Polysilicon Microstructures," Journal of *Microelectromechanical Systems,* vol. 2, No. 3, Sep. 1993; pp. 106–110.
Kenneth Bean, et al., "Anisotropic Etching of Silicon," IEEE Transactions on Electron Devices, vol. Ed–25, No. 10, Oct. 1978.
Dino R. Ciarlo, "A latching accelerometer fabricated by the anisotropic etching of (110) oriented silicon wafers," Lawrence Livermore Nat'l Laboratory, Mar. 1, 1992.
A.S. Dewa, et al., "Development of a Silicon Two–Axis Micromirror for an Optical Cross–Connect," Solid State Sensors and Actuators Workshop, Hilton Head, South Carolina, pp. 93–96.
Joseph Ford et al., "Wavelength Add Drop Switching Using Tilting Micromirrors," Journal of Lightwave Technology, vol. 17, No. 5, May 1999.
J. Grade et al., A Large–Deflection Electrostatic Actuator for Optical Switching Applications, Solid–State Sensor and Actuator Workshop, Hilton Head Island, South Carolina, Jun. 4–8, 2000; pp. 97–100.

(List continued on next page.)

*Primary Examiner*—Thomas M. Dougherty
(74) *Attorney, Agent, or Firm*—Townsend and Townsend and Crew LLP

(57) ABSTRACT

A number of methods and systems for overcoming stiction are provided. The systems include electro-mechanical systems capable of exerting a variety of forces upon areas prone to stiction. The systems can be MEMS arrays or other types of devices where stiction related forces occur. The methods include a variety of ways of causing movement in areas prone to stiction forces. Such movement can be vibrational in nature and is sufficient to overcome stiction, allowing a trapped element to be moved to a desired location.

28 Claims, 14 Drawing Sheets

OTHER PUBLICATIONS

V. Kaajakari et al.; "Ultrasonic Actuation for MEMS Dormancy–Related Stiction Reduction," In MEMS Reliability for Critical Applications, Proceedings of SAPIE vol. 4180 (2000); pp. 60–65.

T.L. Koch et al., "Anisotropically etched deep gratings for InP/InGaAsP optical devices," J.App. Phys. 62 (8), Oct. 15, 1987.

I. Nishi et al., "Broad–Passband–Width Optical Filter for Multi–Demultiplexer Using a Diffraction Grating and a Retroreflector Prism," Electronics Letters, vol. 21, No. 10, May 9, 1985.

P. Phillippe et al., "Wavelength demultiplexer: using echelette gratings on silicon substrate," Applied Optics, vol. 24, No. 7, Apr. 1, 1985.

M. Schilling et al., "Deformation–free overgrowth of reactive ion beam etched submicron structures in InP by liquid phase epitaxy," Appl. Phys. Lett. 49 (12), Sep. 22, 1986.

Z.J. Sun et al., Demultiplexer with 120 channels and 0.29–nm Channel Spacing, IEEE Photonics Technology Letters, vol. 10, No. 1, Jan. 1998.

W. Tang, et al., "Electrostatically Balanced Comb Drive for Controlled Levitation," Reprinted from Technical Digest IEEE Solid–State Sensor and Actuator Workshop, Jun. 1990; pp. 198–202.

L. Torcheux et al., "Electrochemical Coupling Effects on the Corrosion of Silicon Samples in HF Solutions," J. Electrochem.Soc., vol. 142, No. 6, Jun. 1995.

P. VanKessel et al., "A MEMS–Based Projection Display," Proceedings of the IEEE, vol. 86, No. 8, Aug. 1998; pp. 1687–1704.

Microfabricated Silicon High Aspect Ratio Flexures for In–Plane Motion; dissertation by C. Keller, Fall 1998.

Gimballed Electrostatic Microactuators with Embedded Interconnects; dissertation by L. Muller; Spring 2000.

* cited by examiner

SYSTEMS AND METHODS FOR OVERCOMING STICTION

BACKGROUND OF THE INVENTION

This invention relates generally to the field of micro-electrical-mechanical systems (MEMS), and in particular, to improved MEMS devices and methods for their use with fiber-optic communications systems.

The Internet and data communications are causing an explosion in the global demand for bandwidth. Fiber optic telecommunications systems are currently deploying a relatively new technology called dense wavelength division multiplexing (DWDM) to expand the capacity of new and existing optical fiber systems to help satisfy this demand. In DWDM, multiple wavelengths of light simultaneously transport information through a single optical fiber. Each wavelength operates as an individual channel carrying a stream of data. The carrying capacity of a fiber is multiplied by the number of DWDM channels used. Today DWDM systems employing up to 80 channels are available from multiple manufacturers, with more promised in the future.

In all telecommunication networks, there is the need to connect individual channels (or circuits) to individual destination points, such as an end customer or to another network. Systems that perform these functions are called cross-connects. Additionally, there is the need to add or drop particular channels at an intermediate point. Systems that perform these functions are called add-drop multiplexers (ADMs). All of these networking functions are currently performed by electronics—typically an electronic SONET/SDH system. However SONET/SDH systems are designed to process only a single optical channel. Multi-wavelength systems would require multiple SONET/SDH systems operating in parallel to process the many optical channels. This makes it difficult and expensive to scale DWDM networks using SONET/SDH technology.

The alternative is an all-optical network. Optical networks designed to operate at the wavelength level are commonly called "wavelength routing networks" or "optical transport networks" (OTN). In a wavelength routing network, the individual wavelengths in a DWDM fiber must be manageable. New types of photonic network elements operating at the wavelength level are required to perform the cross-connect, ADM and other network switching functions. Two of the primary functions are optical add-drop multiplexers (OADM) and wavelength-selective cross-connects (WSXC).

In order to perform wavelength routing functions optically today, the light stream must first be de-multiplexed or filtered into its many individual wavelengths, each on an individual optical fiber. Then each individual wavelength must be directed toward its target fiber using a large array of optical switches commonly called an optical cross-connect (OXC). Finally, all of the wavelengths must be re-multiplexed before continuing on through the destination fiber. This compound process is complex, very expensive, decreases system reliability and complicates system management. The OXC in particular is a technical challenge. A typical 40–80 channel DWDM system will require thousands of switches to fully cross-connect all the wavelengths. Conventional opto-mechanical switches providing acceptable optical specifications are too big, expensive and unreliable for widespread deployment.

In recent years, micro-electrical-mechanical systems (MEMS) have been considered for performing functions associated with the OXC. Such MEMS devices are desirable because they may be constructed with considerable versatility despite their very small size. In a variety of applications, MEMS component structures may be fabricated to move in such a fashion that there is a risk of stiction between that component structure and some other aspect of the system. One such example of a MEMS component structure is a micromirror, which is generally configured to reflect light from two positions. Such micromirrors find numerous applications, including as parts of optical switches, display devices, and signal modulators, among others.

In many applications, such as may be used in fiber-optics applications, such MEMS-based devices may include hundreds or even thousands of micromirrors arranged as an array. Within such an array, each of the micromirrors should be accurately aligned with both a target and a source. Such alignment is generally complex and typically involves fixing the location of the MEMS device relative to a number of sources and targets. If any of the micromirrors is not positioned correctly in the alignment process and/or the MEMS device is moved from the aligned position, the MEMS device will not function properly.

In part to reduce the complexity of alignment, some MEMS devices provide for individual movement of each of the micromirrors. An example is provided in FIGS. 1A–1C illustrating a particular MEMS micromirror structure that may take one of three positions. Each micromirror 116 is mounted on a base 112 that is connected by a pivot 108 to an underlying base layer 104. Movement of an individual micromirror 116 is controlled by energizing actuators 124a and/or 124b disposed underneath base 112 on opposite sides of pivot 108. Hard stops 120a and 120b are provided to limit movement of base 112. Energizing left actuator 124a causes micromirror 116 to tilt on pivot 108 towards the left side until one edge of base 112 contacts left hard stop 120a, as shown in FIG. 1A. In such a titled position, a restorative force 150, illustrated as a direction arrow, is created in opposition to forces created when left actuator 124a is energized.

Alternatively, right actuator 124b may be energized to cause the micromirror 116 to tilt in the opposite direction, as shown in FIG. 1B. In such a titled position, a restorative force 160, illustrated as a direction arrow, is created in opposition to forces created when right actuator 124b is energized. When both actuators 124 are de-energized, as shown in FIG. 1C, restorative forces 150, 160 cause micromirror 116 to assume a horizontal static position. Thus, micromirror 116 may be moved to any of three positions. This ability to move micromirror 116 provides a degree of flexibility useful in aligning the MEMS device, however, alignment complexity remains significant.

In certain applications, once the micromirror is moved to the proper position, it may remain in that position for ten years or more. Thus, for example, one side of an individual micromirror may remain in contact with the hard stop for extended periods. Maintaining such contact increases the incidence of dormancy related stiction. Such stiction results in the micromirror remaining in a tilted position after the actuators are de-energized. Some theorize that stiction is a result of molecule and/or charge buildup at the junction between the micromirror and the hard stop. For example, it has been demonstrated that an accumulation of $H_2O$ molecules at the junction increases the incidence of stiction.

In "Ultrasonic Actuation for MEMS Dormancy-Related Stiction Reduction", Proceedings of SPIE Vol. 4180 (2000), Ville Kaajakari et al. describe a system for overcoming both molecule and charge related stiction. The system operates by periodically vibrating an entire MEMS device to overcome stiction forces. While there is evidence that vibrating the entire MEMS device can overcome stiction, such vibration causes temporary or even permanent misalignment of the device. Thus, freeing an individual micromirror often requires performance of a costly alignment procedure. Even where the device is not permanently misaligned by the vibration, it is temporarily dysfunctional while the vibration is occurring.

Thus, there exists a need in the art for systems and methods for increasing alignment flexibility of MEMS devices and for overcoming stiction in MEMS devices without causing misalignment.

SUMMARY OF THE INVENTION

The present invention provides improved MEMS devices for use with all optical networks, and methods of using and making the same. Therefore, some embodiments of the invention include a structural plate comprising a micromirror. For example, the present invention may be used with the exemplary wavelength routers described in co-pending U.S. patent application Ser. No. 09/422,061, filed Nov. 16, 1999, the complete disclosure of which is herein incorporated by reference.

Embodiments of the present invention comprise methods and apparatus related to overcoming stiction in electro-mechanical devices. For example, some embodiments provide methods for overcoming stiction electro-mechanical systems. The methods can include providing a base layer with a contact area or with a stop disposed on the base layer. A structural plate is disposed above the base layer with one side of the structural plate in contact with the contact area or stop. At the point where the structural plate contacts the contact area, a stiction force impedes movement of the structural plate away from the contact area. To overcome this stiction force, a local vibration is created at or near the contact area.

In some embodiments, the local vibration is caused by mechanical contact at or near the contact area. In other embodiments, the local vibration is caused by exciting a mass near the contact area at a frequency at or near the resonant frequency of the mass. In yet other embodiments, the local vibration is caused by activating and deactivating an actuator such that a serpentine structure or other spring structure is repetitively moved resulting in a vibration.

Yet other embodiments of the present invention provide systems capable of overcoming stiction forces. Such systems can include a base layer with a structural plate supported above the base layer by a pivot. The structural plate is moveable along a movement path until it contacts a stop located at a position along the movement path. Stiction forces can result at the contact between the structural plate and the stop. To overcome the stiction forces, a local vibration element is provided at or near the contact between the stop and the structural plate. The vibration element provides local vibration sufficient to overcome the stiction forces.

The summary provides only a general outline of the embodiments according to the present invention. Many other objects, features and advantages of the present invention will become more fully apparent from the following detailed description, the appended claims and the accompanying drawings.

BRIEF DESCRIPTION OF THE DRAWINGS

A further understanding of the nature and advantages of the present invention may be realized by reference to the Figs. which are described in remaining portions of the specification. In the figures, like reference numerals are used throughout several to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DESCRIPTION OF THE SPECIFIC EMBODIMENTS

1. Definitions

Figure 1A:
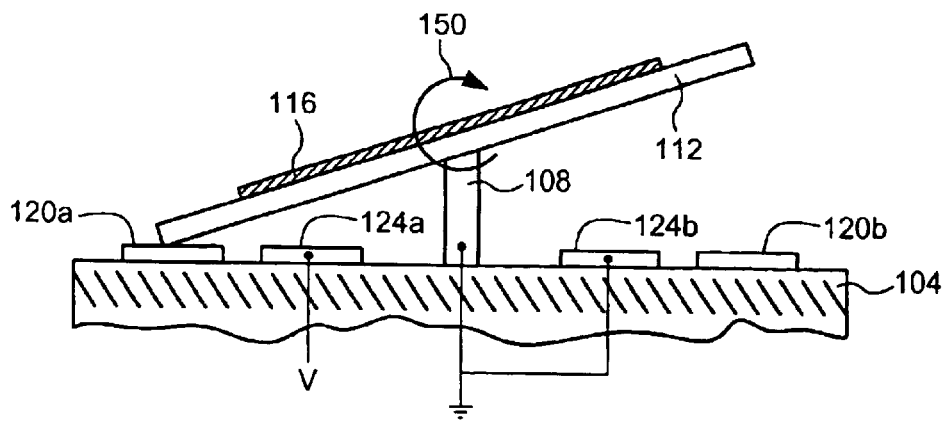
FIGS. 1A, 1B, and 1C are cross-sectional diagrams of a tilting micromirror controlled by actuation of different actuators.
Figure 1B:
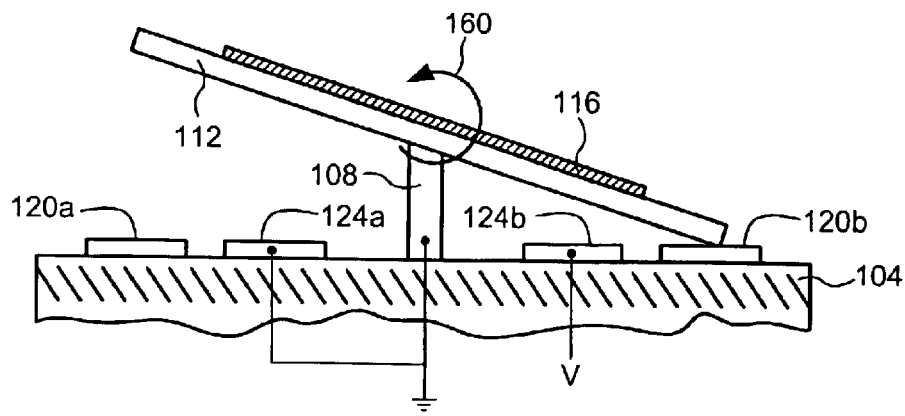
Figure 1C:
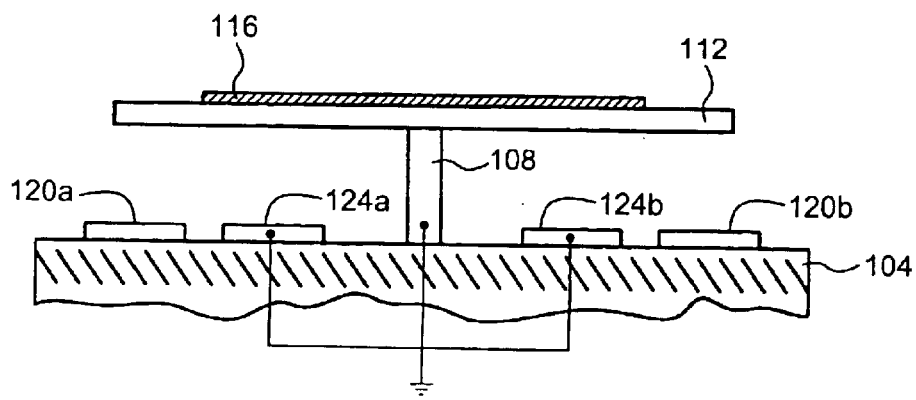

For purposes of this document, a structural plate refers to a substantially planar structure disposed on a pivot. The structural plate can be a rectangular plate, or other such member, capable of movement on the pivot. Such flexure movement from a static position is opposed by a restoring force developed near the contact between the pivot and the structural plate. Thus, the structural plate can be deflected by applying a force to the beam and when the force is removed, the structural plate returns to a static position. Such structural plates can include a cantilever beam where one edge of the structural plate is closer to the pivot than an opposite edge.

The pivot can be any member capable of supporting the structural plate in a way that allows the structural plate to deflect or tilt to one or more sides. For example, the pivot can be a post disposed near the center of a rectangular shaped structural plate. Alternatively, the pivot can be a rectangular shaped plate disposed across a pivot axis of the structural plate. Yet another alternative includes a series of two or more posts disposed across a pivot axis of the structural plate. Pivots can also be a complex structure allowing for the movement of a supported structural plate. For example, a pivot can be a bending or torsion element, or a hinged element. Thus, one of ordinary skill in the art will recognize a number of other members and/or geometries which are suitable as pivots.

2. Introduction

Embodiments of the invention are directed to MEMS methods and devices which use localized vibration to overcome stiction forces. Such methods of localized vibration can include creating a mechanical vibration at or near locations prone to stiction forces. Such areas prone to stiction forces can include, for example, areas where a tilted structural plate contacts a base layer or a hard stop formed above a base layer. In some embodiments vibration is localized to a particular structural plate, while in other embodiments, vibration is localized to a group of structural plates. The localized vibration can include vibration along a vertical vector, a horizontal vector, or a combination of vertical and horizontal vectors.

In various embodiments, vibrational structures are formed at or near locations prone to stiction forces. Such vibrational structures can be actuated to create localized vibration, which is useful for overcoming stiction forces. The vibrational structures can include a mass which is excited by an external force, such that the mass vibrates. Other vibrational structures can include elements formed to utilize the elastic properties of the elements to generate vibrations local to the element. Such vibrational structures can be coupled to or integral with either a base layer, a structural plate, or a combination thereof. Structures according to the present invention can be fabricated according to MEMS fabrication techniques known in the art, or any other applicable techniques known in the art.

In other embodiments, localized vibration can be created by tapping a mechanical element at or near the area prone to stiction forces. Such tapping can be done at a variety of frequencies. Thus, the present invention provides a number of systems and methods for overcoming stiction through use of localized vibration. As will be apparent to anyone of ordinary skill in the art, the systems and methods of the present invention are applicable to a wide variety of applications where stiction forces are involved.

3. Vibration Through Excitation by a Direct Current (DC) Potential

Figure 2A:
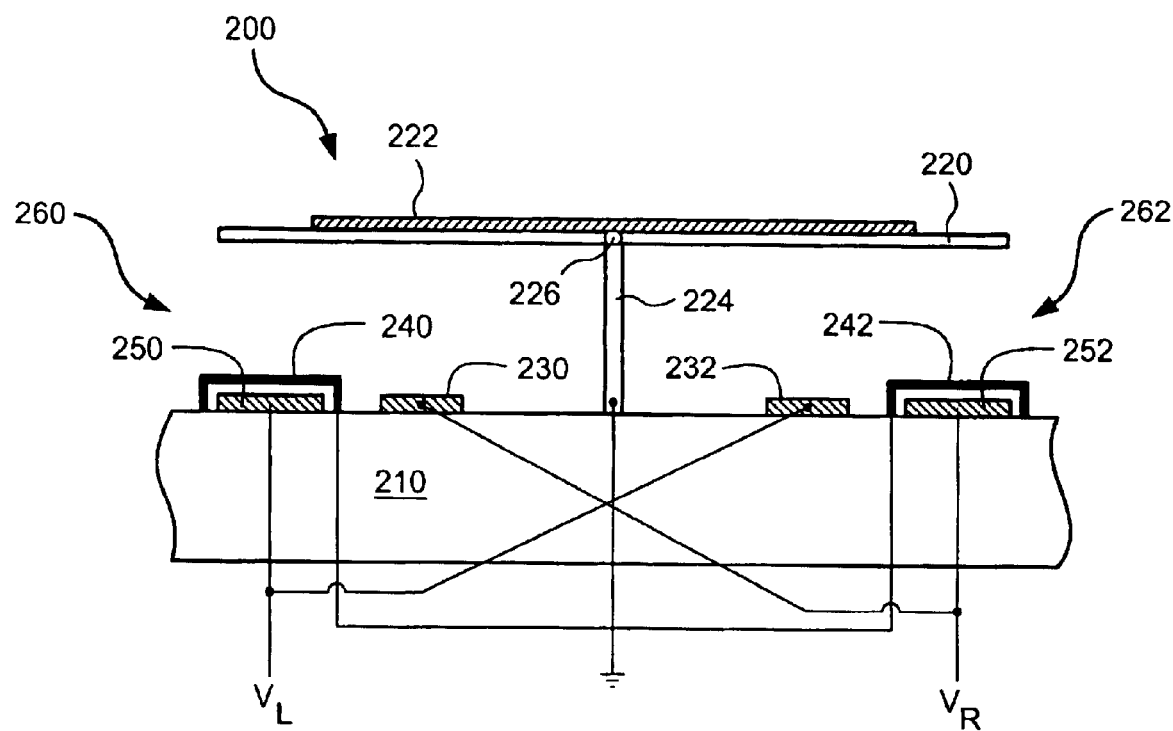
FIG. 2A is a cross-sectional diagram of a tilting structural plate surrounded on either side by actuators including overlying vibrational structures according to embodiments of the present invention.

FIG. 2A illustrates an embodiment of the present invention applied to a structural plate micromirror system 200. Specifically, FIG. 2A illustrates structural plate micromirror system 200 with a structural plate 220 in a static horizontal position. Structural plate 220 is supported above a base layer 210 by a pivot 224 and a micromirror 222 is disposed on structural plate 220. Structural plate 220, including micromirror 222, can be deflected to either the right or the left about a pivot point 226, which in some embodiments is located at the junction of structural plate 220 and pivot 224. Pivot 224, similar to other pivots discussed herein, can be a complex structure allowing for the movement of a supported structural plate. For example, pivot 224 can be a bending or torsion element, or a hinged element.

A left actuator 230 is used to deflect structural plate 220 to the left and a right actuator 232 is used to deflect structural plate 220 to the right. Structural plate 220 can be deflected to the left such that it contacts a left stop 260. Left stop 260 includes a left vibrational actuator 250 and a left overlying structure 240. Similarly, structural plate 220 can be deflected to the right such that it contacts a right stop 262 which includes a right vibrational actuator 252 and a right overlying structure 242.

In operation, left actuator 230 is actuated, along with right vibrational actuator 252, by application of a DC voltage, VR. The potential difference between VR and structural plate 220, which is electrically connected to a common ground, creates an electric field which causes structural plate 220 to tilt, or otherwise deflect, to the left until the end of structural plate 220 contacts left overlying structure 240. In addition, as illustrated in FIG. 2B, contact by structural plate 220 causes the horizontal portion of left overlying structure 240 to bow until the center of the horizontal portion nears left vibrational actuator 250.

Contact between structural plate 220 and left overlying structure 240 is eliminated as structural plate 220 is returned from the left tilt position to the horizontal static position illustrated in FIG. 2A. Return to the horizontal static position is achieved by removing VR from left actuator 230 and right vibrational actuator 252. Under normal circumstances, restoring forces associated with the interaction of structural plate 220 and pivot 224 cause structural plate 220 to return to the horizontal static position. However, in some instances, stiction related forces are sufficient to overcome the restoring forces and structural plate 220 remains tilted to the left even after VR is removed.

The present embodiment of the invention disrupts such stiction related forces through vibration of left overlying structure 240. Such vibration is produced coincident with the removal of VR. More specifically, when VR is removed, the horizontal portion of left overlying structure 240 elastically snaps from the bowed position (illustrated in FIG. 2B) to the non-bowed position (illustrated in FIG. 2A). This movement, or localized vibration, of left overlying portion 240 disrupts any stiction forces, such that the restoring forces associated with structural plate 220 and pivot 224 are sufficient to cause structural plate 220 to return to the static horizontal position illustrated in FIG. 2A. In this embodiment, the localized vibration is primarily along a vertical vector.

Figure 2B:
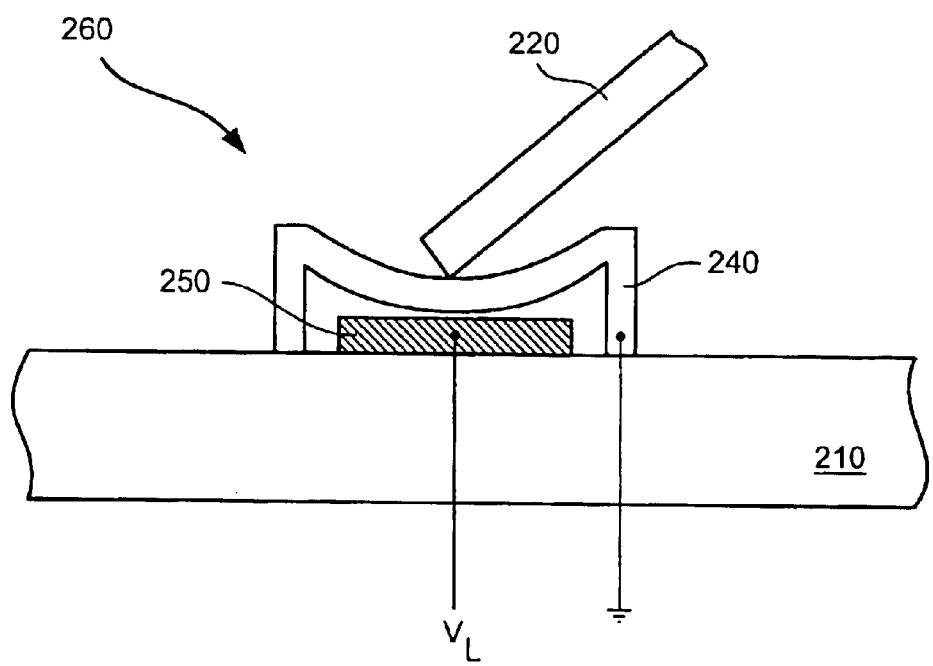
FIGS. 2B and 2C are cross-sectional diagrams illustrating movement the overlying vibrational structures of FIG. 2A according to embodiments of the present invention.
Figure 2C:
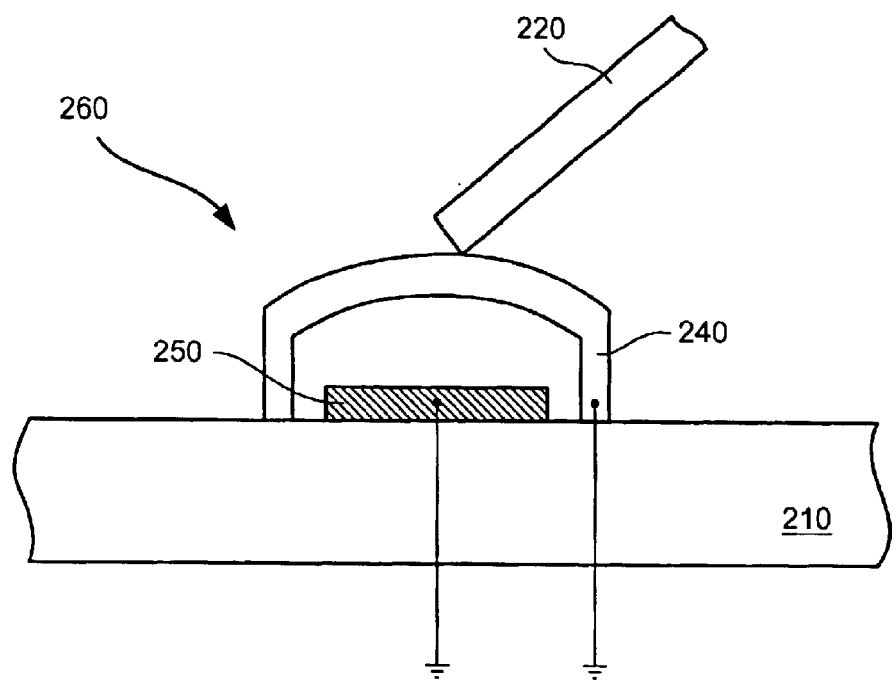

In some embodiments, left overlying structure 240 is engineered such that movement of the horizontal portion of left overlying structure 240 from the bowed position illustrated in FIG. 2B to the non-bowed position illustrated in FIG. 2A involves a damped oscillation between a bowed down position and a bowed tip position. Thus, by removing VR, the horizontal portion of overlying structure 240 oscillates between the positions illustrated in FIGS. 2B and 2C until damping forces stop the oscillation and the left overlying structure comes to rest in the horizontal position illustrated in FIG. 2A. Such oscillation, or localized vibration, sufficiently disrupts any stiction forces such that the restorative forces associated with structural plate 220 are sufficient to return structural plate 220 to the horizontal static position.

At this juncture, it should be recognized that a similar tilt to the right can be achieved and stiction forces resulting from such tilt can be overcome using right actuator 232 and right stop 262.

In some embodiments, left actuator 230 and right vibrational actuator 252 are electrically connected and are thus both actuated when VR is applied. Similarly, right actuator 232 and left vibrational actuator 250 can be electrically connected, such that both are actuated by the application of a voltage potential, VL. Thus, in some embodiments, the functionality of the actuators can be provided with minimal wiring and/or control logic. Alternatively, in some embodiments, left actuator 230 and left vibrational actuator 250, as well as, left actuator 232 and left vibrational actuator 252 are not electrically connected and can be actuated individually. This provides a degree of flexibility when operating structural plate micromirror system 200. In yet other embodiments, left actuator 230 and left vibrational actuator 250 are electrically connected and are thus both actuated when VL is applied. Similarly, right actuator 232 and right vibrational actuator 252 can be electrically connected, such that both are actuated by the application of a voltage potential, VR.

In yet other embodiments, the functionality of left actuator 230 is provided by left vibrational actuator 250, which allows left actuator 230 to be eliminated. Similarly, in some embodiments, the functionality right actuator 232 is provided by right vibrational actuator 252 and right actuator 232 is eliminated. Thus, for example, a left tilt of structural plate 220 is effectuated by applying VL to left vibrational actuator 250 only, in the absence of left actuator 230. Such elimination of left actuator 230 and/or right actuator 232 can provide similar functionality to systems including both actuators, while reducing the number of actuators, wiring, and/or the complexity of any control logic.

Figure 3A:
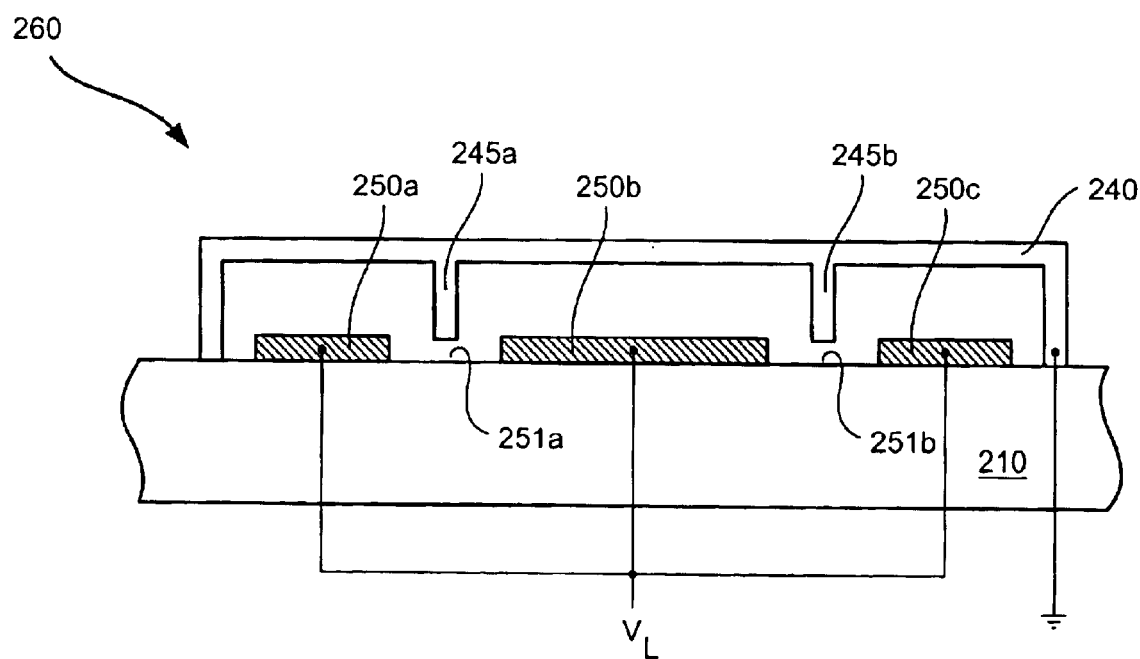
FIGS. 3A and 3B are cross-sectional diagrams illustrating embodiments of the actuators of FIG. 2 according to the present invention.
Figure 3B:
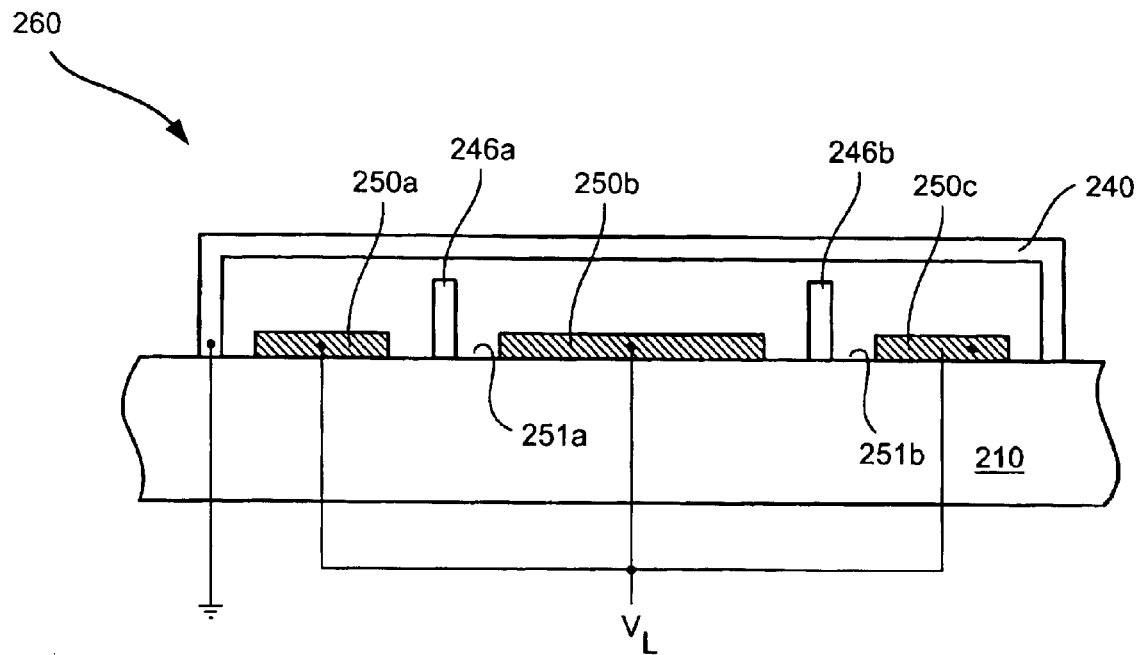

FIGS. 3A and 3B illustrate two embodiments where dimples and standoff structures are used to promote the longevity of left stop 260, and similarly right stop 262. Referring to FIG. 3A, left overlying structure 240 includes standoff structures 245a, 245b formed above dimple areas 251a, 251b. Dimple areas 251a, 251b are formed by cutting out portions of left vibrational actuator 250. Formation of dimples 251a, 251b can include removal of small portions of left vibrational actuator 250 to provide clearance for standoff structures 245a, 245b. One purpose of standoff structures 245a, 245b is to prevent contact between overlying structure 240 and the underlying actuator, thus avoiding a short. For embodiments where standoff structures 245a, 245b are posts, dimple areas 251a, 251b can be circular or rectangular cut out areas of left vibrational actuator 250. Such cut out areas leave left vibrational actuator 250 contiguous, less only relatively small dimple areas 251a, 251b.

Alternatively, standoff structures 245a, 245b can be bars formed across the length of left overlying structure 240, in which case, dimple areas 251a, 251b are formed across the length of left vibrational actuator 250. Formation of such expansive dimples 251a, 251b, effectively sub-divides left vibrational actuator into sub-parts 250a, 250b, 250c.

Standoff structures 245a, 245b contact base layer 210 at dimple areas 251a, 251b when the horizontal portion of left overlying structure 240 is bowed toward left vibrational actuator 250 (similar to that illustrated in FIG. 2A). By contacting base layer 210, standoff structures 245a, 245b prevent left overlying layer 240 from contacting and potentially damaging left vibrational actuator 250. Further, standoff structures 245a, 245b prevent an electrical short between left overlying structure 240 and left vibrational actuator 250. In this way, the longevity of left stop 260 can be increased. Of course, it is recognized that using such standoffs and dimples is similarly applicable to right stop 262.

FIG. 3B illustrates an alternative embodiment where standoffs 246a, 246b are formed in dimple areas 251a, 251b on base layer 210. Similar to the embodiment described in relation to FIG. 3A, standoff structures 246a, 246b prevent left overlying structure 240 from physically contacting left vibrational actuator 250. Also, electrical shorting between left overlying structure 240 and left vibrational actuator 250 is prevented.

Figure 4:
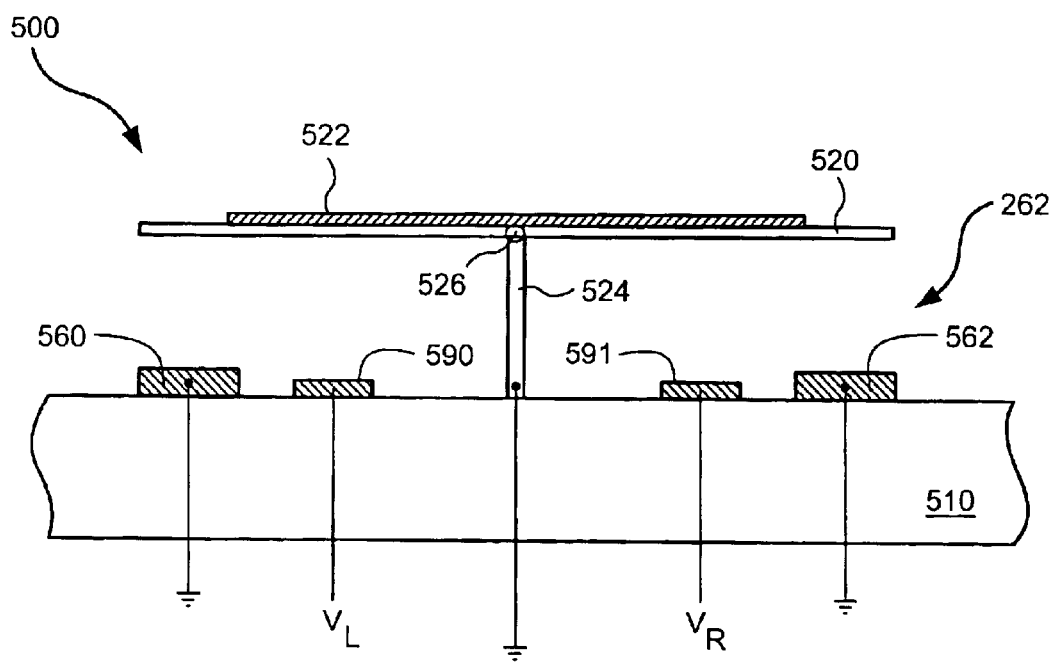
FIG. 4 is a cross-sectional diagram of a tilting structural plate surrounded on either side by vibrating stops according to embodiments of the present invention.

FIG. 4 illustrates an embodiment of the present invention applied to a structural plate micromirror system 500. Specifically, FIG. 4 illustrates structural plate micromirror system 500 with a structural plate 520 in a static horizontal position. Structural plate 520 is supported above a base layer 510 by a pivot 524 and a micromirror 522 is disposed on structural plate 520. Structural plate 520, including micromirror 522, can be deflected to either the right or the left about a pivot point 526, which in some embodiments is located at the junction of structural plate 520 and pivot 524.

A left vibrational stop 560 is located next to a left actuator 590 used to deflect structural plate 522 to the left and a right vibrational stop 562 is located next to a right actuator 591 used to deflect structural plate 520 to the right. Structural plate 520 can be deflected to the left such that it contacts left vibrational stop 560. Similarly, structural plate 520 can be deflected to the right such that it contacts a right vibrational stop 562.

In operation, left stop 560 is actuated by application of a (DC) voltage, VL. The potential difference between VL and structural plate 520, which is electrically connected to a common ground, creates an electric field which causes structural plate 520 to tilt, or otherwise deflect, to the left until the end of structural plate 520 contacts left stop 560. In addition, as will be more fully described in relation to FIGS. 5 through 6, the electric field created by applying VL to left actuator 590 causes an elastic displacement of left stop 560.

Contact between structural plate 520 and left stop 560 is eliminated as structural plate 520 is returned from the left tilt position to the horizontal static position illustrated in FIG. 4. Return to the horizontal static position is achieved by removing VL from left actuator 590. Under normal circumstances, restoring forces associated with structural plate 520 and pivot 524 cause structural plate 520 to return to the horizontal static position. However, in some instances, stiction related forces are sufficient to overcome the restoring forces and structural plate 520 remains tilted to the left even after VL is removed.

The present embodiment of the invention disrupts such stiction related forces by vibrating left stop 560. Such vibration is produced coincident with the removal of VL. More specifically, when VL is removed, left stop 560 elastically snaps from the displaced position to a static position. This movement, or localized vibration of left stop 560 disrupts any stiction forces, such that the restoring forces associated with structural plate 520 are sufficient to cause structural plate 520 to return to the static horizontal position. In various embodiments, the localized vibration can be primarily along a vertical vector, primarily along a horizontal vector, or any other vector. Further, such vibration can be actively created by applying an alternating force, or passively created by relying on the elasticity of the materials comprising the structural plate and/or the stop.

Figure 5A:
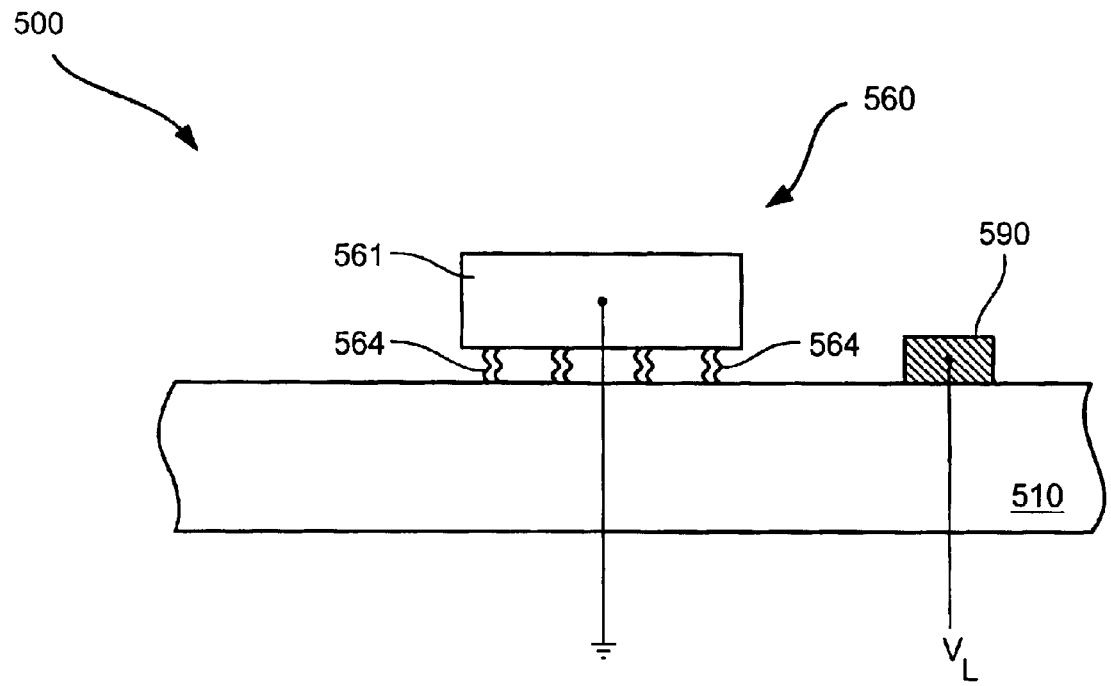
FIG. 5A is a cross-sectional diagram illustrating an embodiment of the stops of FIG. 4 which are capable of vibrating both horizontally and vertically and either passively or actively according to embodiments of the present invention.

Various embodiments which provide such localized vibration are illustrated in FIGS. 5 through 6. Referring to FIG. 5A, an embodiment of left stop 560 according to the present invention is illustrated. In this embodiment, left stop 560 includes an actuator mass 561 supported above base layer 510 by a number of serpentine structures 564. In some embodiments, serpentine stuctures 564 are vertical serpentine structures. In addition, left stop 560 comprises an actuator 590 disposed above base layer 510 and next to stop mass 561.

In operation, VL is applied to actuator 590. Application of VL creates an electric field between left stop 560 and structural plate 520 (not shown) and between stop mass 561 and actuator 590. The electric field causes structural plate 520 to deflect to the left until an end of structural plate 520 contacts stop mass 561. In addition, the electric field causes stop mass 561 to displace toward actuator 590. Such displacement can be both horizontal and vertical depending upon the placement of actuator 590 relative to stop mass 561. Stop mass 561 remains in this displaced position until VL is removed.

When VL is removed from actuator 590, the attraction between stop mass 561 and actuator 590 is eliminated and actuator mass elastically snaps back to a static position. This involves a combination of horizontal and vertical movement, or localized vibration which disrupts any stiction related forces allowing the restorative forces associated with structural plate 520 to return structural plate 520 to the static horizontal position.

In some embodiments, the combination of stop mass 561 and serpentine structures 564 are engineered such that removal of VL results in a damped oscillation of stop mass 561. During such oscillation, or localized vibration, stop mass 561 repeatedly moves away from actuator 590 and subsequently back toward actuator 590 until the oscillation is entirely damped out and stop mass 561 comes to rest in a static position. This localized vibration occurring along various vectors, including a combination horizontal and vertical vector, provides sufficient disruption of any stiction related forces to allow structural plate 520 to return to the horizontal static position.

Figure 5B:
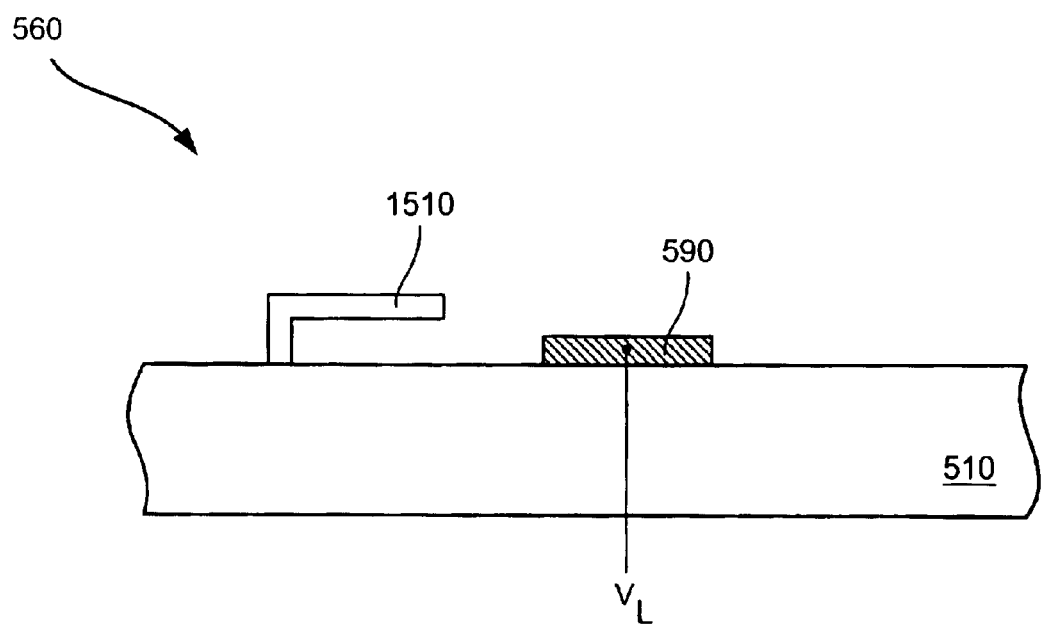
FIGS. 5B and 5C are cross-sectional diagrams illustrating an embodiment of the stops of FIG. 4 which are capable of vibrating vertically according to embodiments of the present invention
Figure 5C:
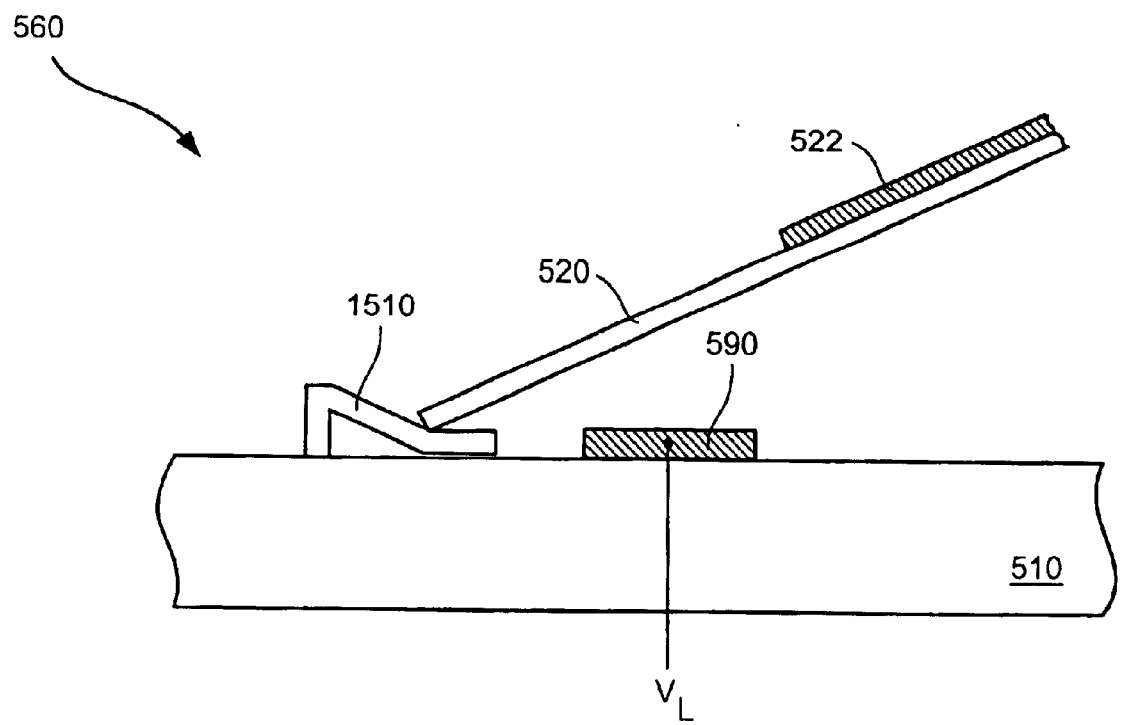

FIGS. 5B and 5C illustrate embodiments of the present invention where the localized vibration occurs primarily along a vertical vector. Referring to FIG. 5B, an embodiment of left stop 560 according to the present invention is illustrated. In this embodiment, left stop 560 includes actuator 590 which is operable to cause structural plate 520 (not shown) to deflect into contact with a deformable pad 1510.

In operation, VL is applied to actuator 590. Application of VL creates an electric field between actuator 590 and structural plate 520 (not shown). The electric field causes structural plate 520 to deflect to the left until an end of structural plate 520 contacts deformable stop 1510 as illustrated in FIG. 5C. Deformable stop 1510 bends to accommodate movement of structural plate 520 toward base layer 510.

When VL is removed from actuator 590, the attraction between actuator 590 and structural plate 520 is eliminated. Elimination of the attractive force allows deformable pad 1510 to elastically snap back to the static position illustrated in FIG. 5B. This involves primarily vertical movement, or localized vibration which disrupts any stiction related forces acting between deformable stop 1510 and structural plate 520 and allowing the restorative forces associated with structural plate 520 to return structural plate 520 to the static horizontal position.

In some embodiments, deformable stop 1510 is engineered such that removal of VL results in a damped oscillation of deformable stop 1510 along a primarily vertical vector. During such oscillation, or localized vibration, deformable stop 1510 repeatedly moves away from base layer 510 and subsequently back toward base layer 510 until the oscillation is entirely damped out and deformable stop 1510 comes to rest in the static position. This localized vibration provides sufficient disruption of any stiction related forces to allow structural plate 520 to return to the horizontal static position.

Figure 6A:
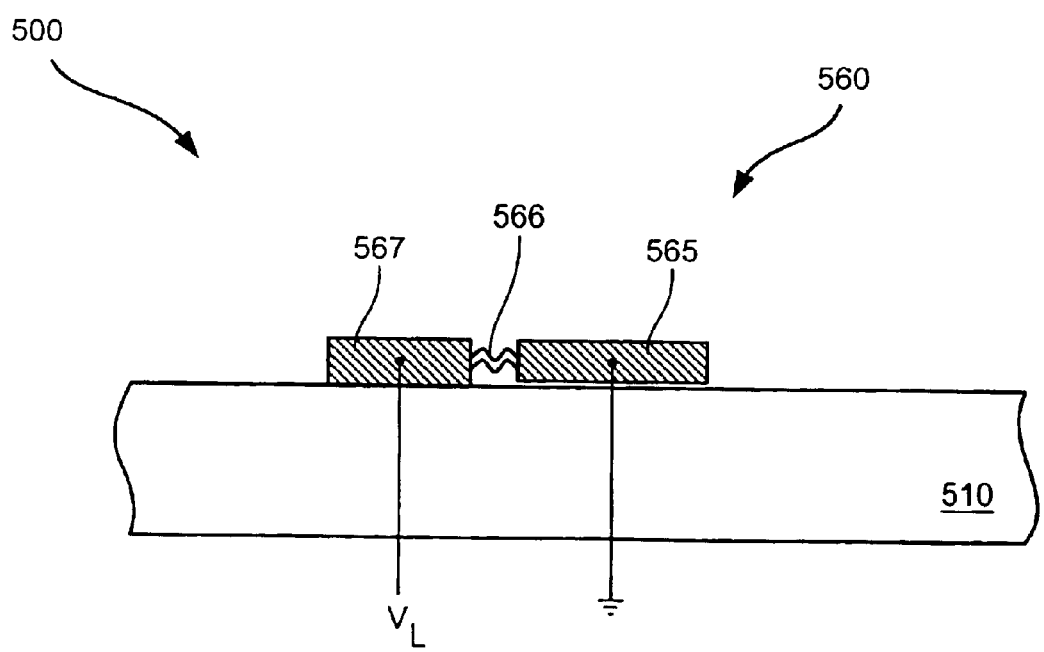
FIGS. 6A and 6B are cross-sectional diagrams illustrating embodiments of the actuators of FIG. 4 which are capable of vibrating horizontally according to embodiments of the present invention.
Figure 6B:
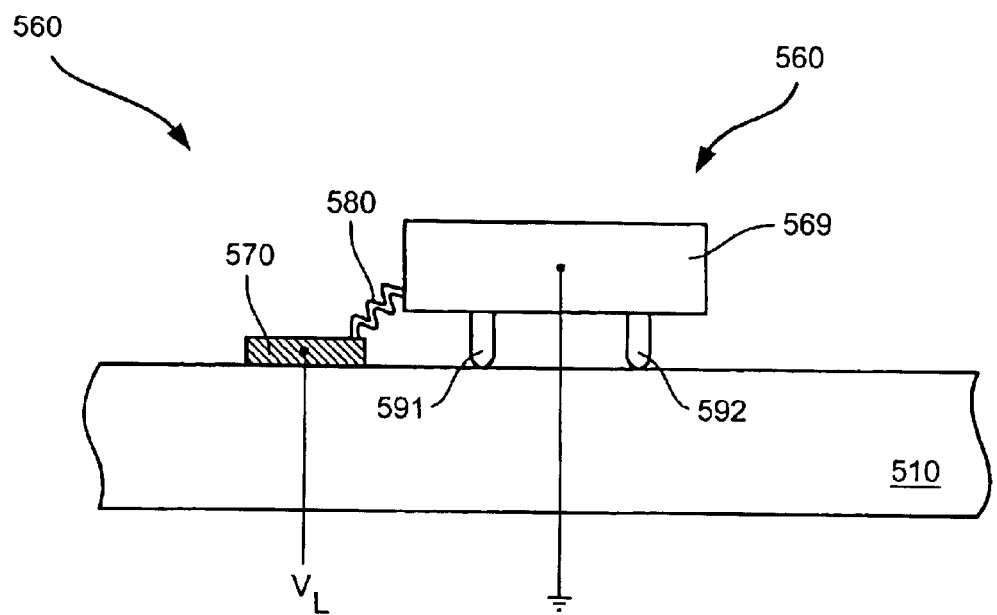

FIGS. 6A and 6B illustrate embodiments of the present invention where the localized vibration occurs primarily along a horizontal vector. Referring to FIG. 6A, an embodiment of left stop 560 according to the present invention is illustrated. In this embodiment, left stop 560 includes an actuator mass 565 which is moveable across base layer 510 and is tethered by a serpentine structure 566 to an anchor mass 567. In some embodiments, actuator mass 565 is supported above base layer 510 by dimples (not shown). The dimples can be useful to reduce friction between actuator mass 565 and base layer 510. Further, in some embodiments, serpentine structure 566 can be a comb drive actuator.

In operation, VL is applied to anchor mass 567. Application of VL creates an electric field between left stop 560 and structural plate 520 (not shown) and between actuator mass 565 and anchor mass 567. The electric field causes structural plate 520 to deflect to the left until an end of structural plate 520 contacts actuator mass 565. In addition, the electric field causes actuator mass 565 to displace horizontally toward actuator 590. Actuator mass 565 remains in this displaced position until VL is removed.

When VL is removed from anchor mass 567, the attraction between actuator mass 565 and anchor mass 567 is eliminated and actuator mass 565 elastically snaps back to a static position. This involves substantially horizontal movement, or localized vibration which disrupts any stiction related forces allowing the restorative forces associated with structural plate 520 to return structural plate 520 to the static horizontal position. In some embodiments significant horizontal forces between actuator mass 565 and structural plate 520 can cause structural plate 520 to break. Thus, in some embodiments, the amount of horizontal movement of actuator mass 565 is limited.

In some embodiments, a combination of actuator mass 565 and serpentine structure 566 are engineered such that removal of VL results in a damped oscillation of actuator mass 565 along a primarily horizontal vector. During such oscillation, or localized vibration, actuator mass 565 repeatedly moves away from anchor mass 567 and subsequently back toward anchor mass 567 until the oscillation is entirely damped out and actuator mass 565 comes to rest in a static position. This localized vibration provides sufficient disruption of any stiction related forces to allow structural plate 520 to return to the horizontal static position.

FIG. 6B illustrates another embodiment of left stop 560 according to the present invention. In this embodiment, left stop 560 includes an stop mass 569 which is supported above base layer 510 by a number of support dimples 591, 592 and tethered by a serpentine structure 580 to an actuator mass 570.

In operation, VL is applied to actuator mass 570. Application of VL creates an electric field between left stop 560 and structural plate 520 (not shown) and between stop mass 569 and actuator mass 570. The electric field causes structural plate 520 (not shown) to deflect to the left until an end of structural plate 520 (not shown) contacts stop mass 569. In addition, the electric field causes stop mass 569 to displace primarily along a horizontal axis toward actuator mass 570. Stop mass 569 remains in this displaced position until VL is removed.

When VL is removed from stop mass 569, the attraction between stop mass 569 and actuator mass 570 is eliminated and stop mass 569 elastically snaps back to a static position. This involves primarily horizontal movement, or localized vibration which disrupts any stiction related forces allowing the restorative forces associated with structural plate 520 to return structural plate 520 to the static horizontal position.

Similar to the embodiment discussed in relation to FIG. 6B, some of the present embodiments involve a damped oscillation which provides the localized vibration sufficient to overcome any stiction related forces.

4. Vibration Through Excitation by an Alternating Current (AC) Potential

The preceding embodiments each involve creation of localized vibration through application and removal of a DC voltage potential. At this juncture, it should be noted that in any of the embodiments described in relation to FIGS. 2 through 6, localized vibration can be created by application of an AC potential. For example, by using an AC voltage or a pulsed DC voltage for VL in the embodiment described in relation to FIG. 2, the frequency at which the horizontal portion of left overlying structure 240 bows and subsequently returns to the static position can be selected by controlling the frequency of VL. It should be recognized that in various embodiments, the present invention can incorporate either a DC voltage in the place of an AC voltage. Thus, for example, where VL is a voltage potential alternating between ground and ten (10) volts at a frequency of 60 Hz, left overlying structure 240 will bow and return to a static position at a rate of 60 Hz. Such voltages and frequencies can be tailored to a particular application. Of course, the elasticity of the material forming left overlying structure 240 can affect the rate and therefore should be selected accordingly. In such embodiments, the localized vibration is provided at a frequency corresponding to the frequency of the applied AC voltage.

Figure 7:
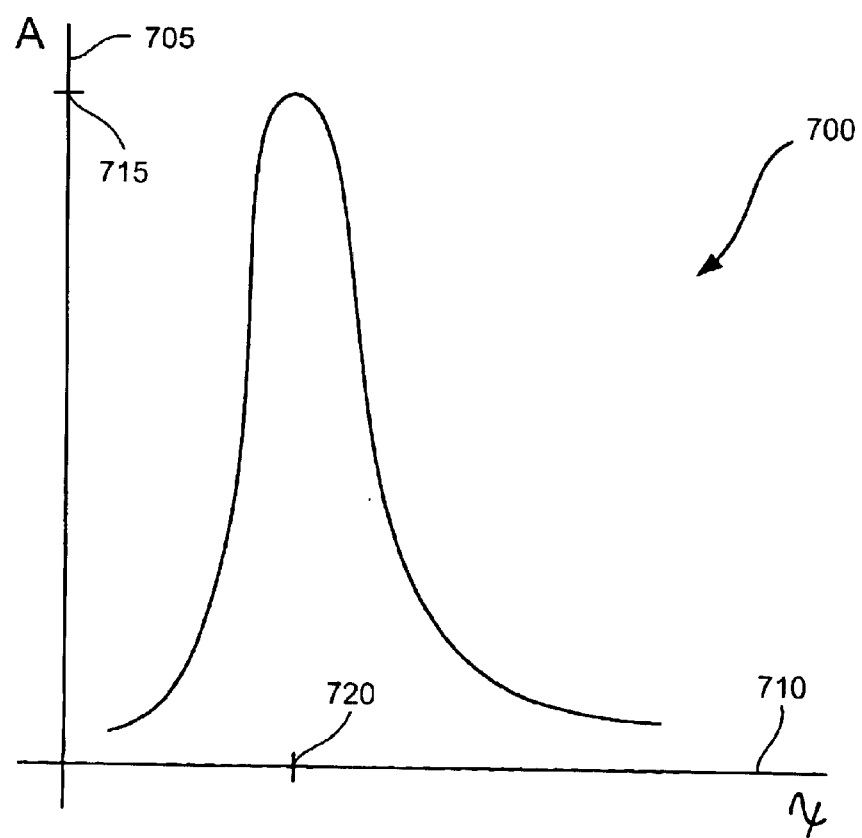
FIG. 7 illustrates an amplitude curve for a mass excited at or near its natural frequency.

Yet further embodiments of the present invention provide localized vibration by exciting an actuator mass and/or a hard stop with an AC voltage alternating at or near the natural frequency of the actuator mass and/or a hard stop. FIG. 7 illustrates an amplitude curve 700 for the vibration of a mass excited by a driving force. The amplitude of a vibration is noted on a vertical axis 705 and the frequency of the driving force is noted on a horizontal axis 710. The peak of amplitude curve 700 occurs at an amplitude value 715 where a frequency 720 of the driving force is close to the natural frequency of the vibrating mass. Frequency 720 is often referred to as the resonant frequency. At the resonant frequency, the amplitude of the vibration is maximized, however, vibration is ongoing for frequencies on either side of frequency 720. By exciting the vibrating mass at or near the resonant frequency, the amplitude of the vibration can be made very large through repeated application of a relatively small force.

Additionally, significant vibration can be achieved by exciting a mass using a driving frequency at or near one of the harmonic frequencies of the material comprising the actuator and/or hard stop. Thus, one of ordinary skill in the art will recognize that a number of different driving frequencies may be used to excite the mass.

Such an approach of creating localized vibration through application of a driving force at or near the natural frequency of a material can be applied to the embodiments described in relation to FIGS. 2 through 6. For example, an AC voltage, VL, can be applied to left stop 560 of FIG. 4. Where the frequency of VL is at or near the natural frequency of the material comprising left stop 560, it will oscillate. Such oscillations provide the localized vibration sufficient to overcome stiction related forces. While the preceding example is described using an AC voltage potential to excite the mass, it should be recognized by one skilled in the art that other energy types may be used to excite the actuator. For example, a sound wave with a frequency at or near the natural frequency of the material comprising the actuator may be used to excite the actuator to vibrate.

Figure 8A:
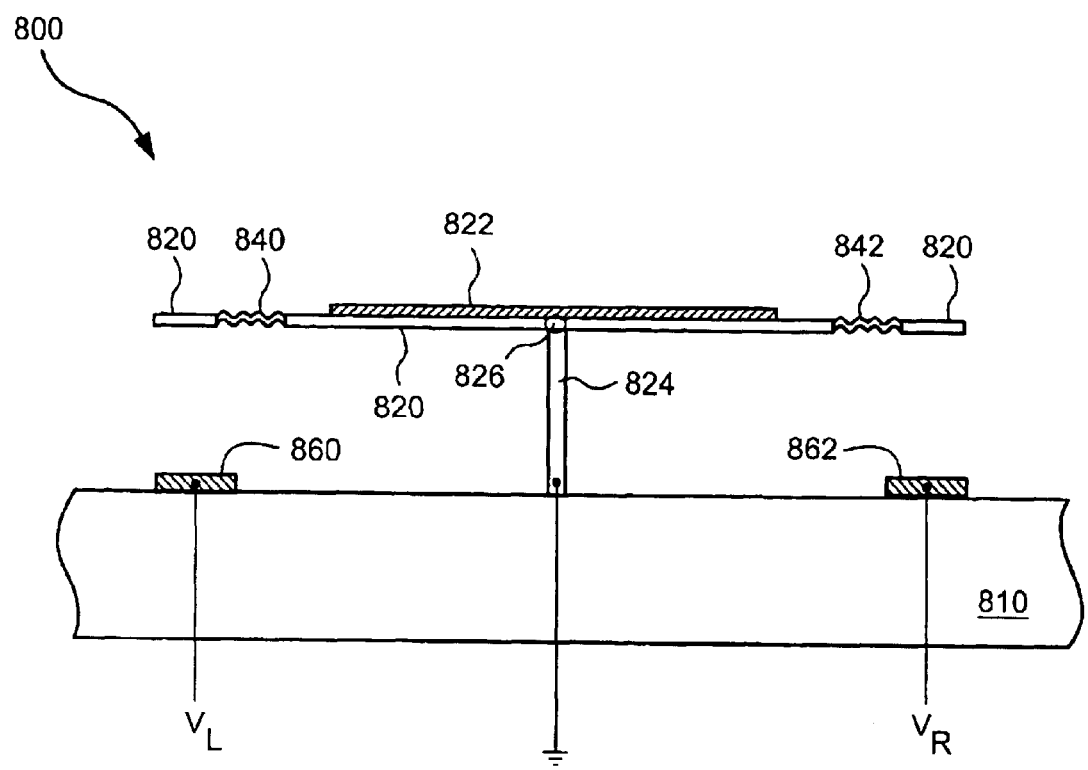
FIG. 8A is a cross-sectional diagram of a tilting structural plate including vibrational elements integral thereto according to embodiments of the present invention.
Figure 8B:
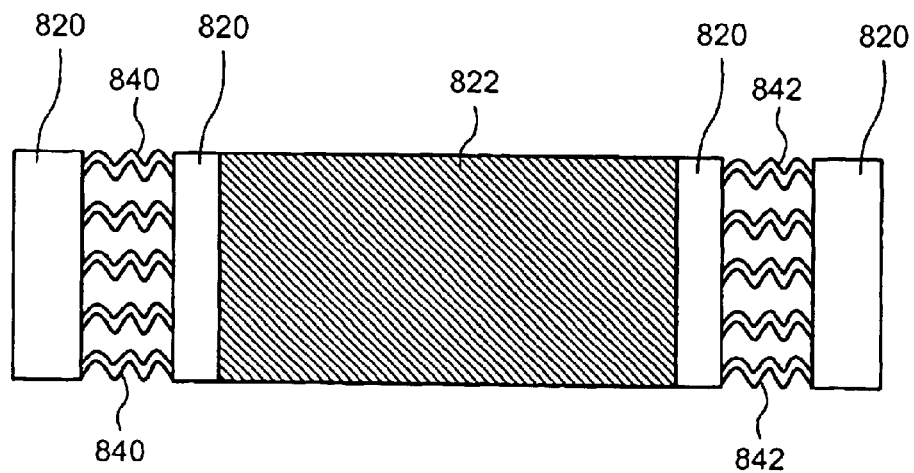
FIG. 8B is a top level diagram of the tilting structural plate of FIG. 8A.

FIGS. 8A and 8B illustrate yet another embodiment of the present invention which is describe herein to provide localized vibration by application of an AC voltage with a frequency at or near the natural frequency of the vibrating mass. However, it will be recognized by any one of skill in the art that the present embodiment can be used to provide localized vibration by application of a DC voltage or by an AC voltage not necessarily at or near the natural frequency of the material. Such localized vibration is provided consistent with methods and operations of the previously described embodiments.

More specifically, FIG. 8A illustrates a structural plate micromirror system 800 with a structural plate 820 in a static horizontal position. Structural plate 820 includes left serpentine structures 840 and right serpentine structures 842, which are designed to promote vibration of structural plate 820. In some embodiments, structural plate 820 is vibrated according to the principles discussed in relation to FIG. 7. Similar to prior embodiments, structural plate 820 is supported above a base layer 810 by a pivot 824 and a micromirror 822 is disposed on structural plate 820. Structural plate 820, including micromirror 822, can be deflected to either the right or the left about a pivot point 826, which in some embodiments is located at the junction of structural plate 820 and pivot 824.

A left actuator 860 is used to deflect structural plate 822 to the left and a right actuator 862 is used to deflect structural plate 820 to the right. Structural plate 820 can be deflected to the left such that it contacts base layer 810 or a hard stop disposed thereon. Similarly, structural plate 820 can be deflected to the right such that it contacts base layer 810 or a hard stop disposed thereon. FIG. 8B provides a top level schematic diagram of structural plate 820, including left and right serpentine structures 840, 842 and micromirror 822.

In operation, left actuator 860 is actuated by application of a voltage, VL. In some embodiments, VL is initially a DC voltage potential which creates an electric field attracting structural plate 820 to tilt, or otherwise deflect to the left until an edge of structural plate 820 contacts base layer 810 or a hard stop disposed thereon. Similar to previously described embodiments, VL is then removed allowing structural plate 820 to return to the static horizontal position illustrated in FIG. 8A. Again, however, stiction related forces occasionally prevent such a return of structural plate 820 to the static horizontal position.

To overcome these stiction related forces, an AC voltage, VL', is applied to left actuator 860. The frequency of VL' is chosen to be at or near the natural frequency of left serpentine structures 840. The alternating potential difference between VL' and the common ground coupled to structural plate 820 creates an alternating electric field and causes left serpentine structures to oscillate according the principles discussed in relation to FIG. 7. The alternating electric field is insufficient to maintain structural plate 820 in contact with base layer 810, but does create sufficient localized vibration to disrupt stiction related forces and allow the restorative forces associated with structural plate 820 to return structural plate 820 to the horizontal static position.

Figure 8C:
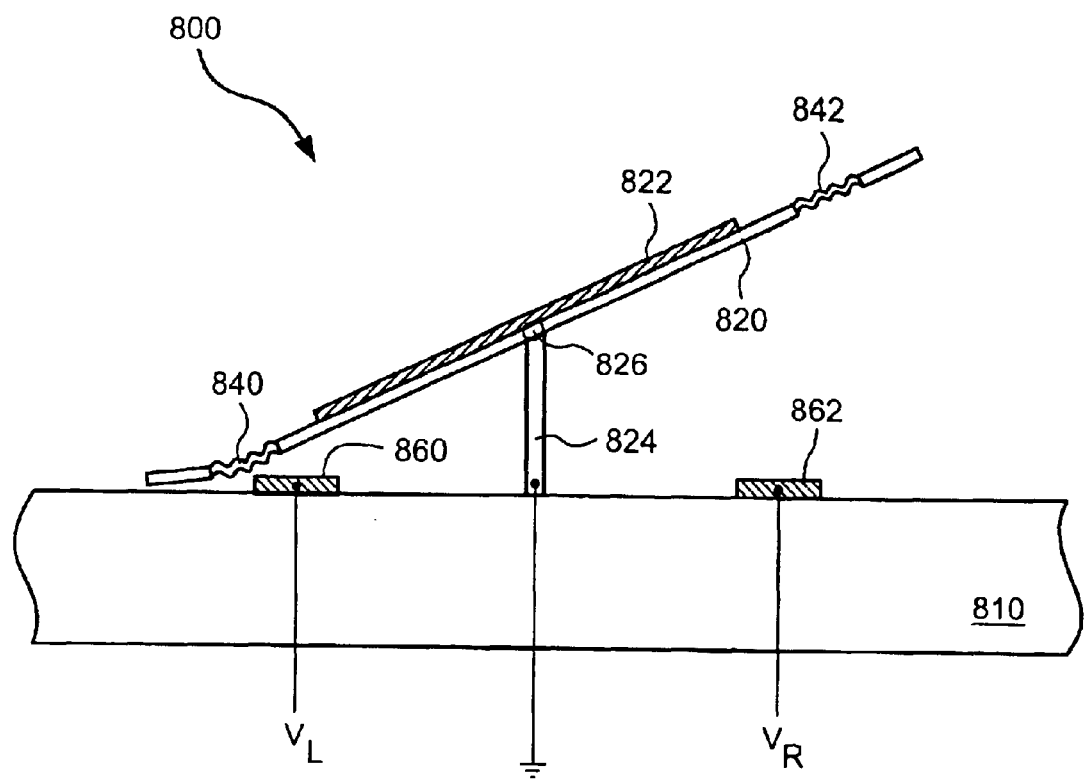
FIG. 8C illustrates the tilting structural plate of FIG. 8A in a left tilt position with the vibrational element flexed according to embodiments of the present invention.

As previously discussed, the embodiment described in relation to FIGS. 8A through 8B can also be used to create localized vibration through the application of either a DC voltage or an AC voltage not necessarily near the natural frequency of any of the structures. For example, FIG. 8C illustrates an embodiment where structural plate 820 is designed to flex at serpentine elements 840, 842. Thus, for example, when VL is applied to left actuator 860 causing structural plate 820 to tilt to the left, structural plate 820 flexes at serpentine structures 840 as the end of structural plate 820 contacts base layer 810. The flex point associated with serpentine structures 840 stores energy which is released when VL is removed from left actuator 860. This release of energy causes structural plate 820 to return to its straight static position. In returning to the static position, the end of structural plate 820 moves relative to base layer 810. Such movement, or local vibration, is sufficient to overcome stiction related forces, and the restorative forces associated with structural plate 820 and pivot 824 act to return structural plate 820 to the static horizontal position.

In some embodiments, the release of energy from the flexure associated with serpentine elements 840 results in a damped oscillation as serpentine elements 840 repeatedly bow toward base layer 810 and away from base layer 810 until the oscillation is finally damped out and structural plate 820 comes to rest in a straight position. Such oscillation results in a localized vibration at the point where structural plate 820 contacts base layer 810. This localized oscillation disrupts stiction related forces and allows the restorative forces to return structural plate 820 to the static horizontal position.

Figure 8D:
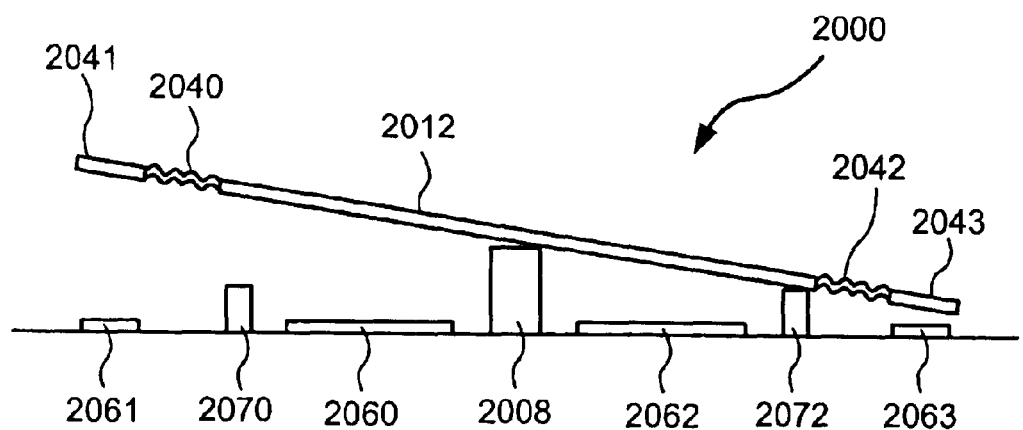
FIGS. 8D and 8E illustrate an embodiment of the present invention including connected vibrational and movement actuators.
Figure 8E:
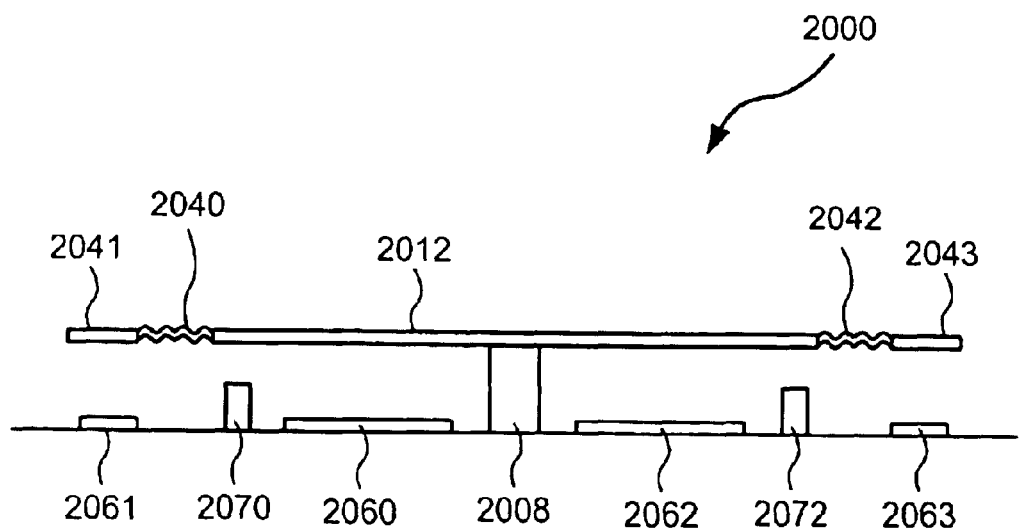

Referring to FIGS. 8D and 8E, a system 2000 including a structural plate 2012 disposed above pivot 2008 is disclosed. Structural plate 2012 includes a right vibration mass 2043 attached via a right serpentine structure 2042. Similarly, a left vibration mass 2041 is attached via a left serpentine structure 2040. Structural plate 2012 can be deflected to the right by energizing right actuator 2062 and similarly deflected to the left by energizing left actuator 2060. When deflected to the right, structural plate 2012 contact a stop 2072. In addition, a right vibration electrode 2063 and a left vibration electrode 2061 are disposed under the respective right and left vibration masses 2043, 2041.

In some embodiments, right vibration electrode 2063 is electrically connected to right actuator 2062. Similarly, left actuator 2060 is electrically connected to left vibration electrode 2061. In other embodiments, left actuator 2060 is electrically connected to right vibration electrode 2063, while right actuator 2062 is electrically connected to left vibration electrode 2061. In yet other embodiments, all vibration electrodes 2061, 2063 are connected via a common bond pad (not shown).

As illustrated in FIG. 8D, structural plate 2012 is stuck due to stiction in a right tilt position with all actuators and vibration electrodes de-energized. To overcome the stiction between structural plate 2012 and stop 2072, right vibration electrode is energized using an AC voltage or a pulsed DC voltage. Application of this voltage causes right vibration mass 2043 to be attracted toward right vibration electrode 2063 and release. This is repeated as the applied voltage changes state causing right vibration mass 2043 to vibrate. Such vibration increases until the stiction between stop 2072 and structural plate 2012 is overcome.

In embodiments where right vibration electrode 2063 is electrically connected to left actuator 2060, left actuator 2060 is energized in unison with the energization of right vibration electrode 2063. Energization of left actuator 2060 creates attraction between the actuator and structural plate 2012 which aids in overcoming the stiction. With the stiction overcome, restorative forces associated with structural plate 2012 and pivot 2008 cause the structural plate to return to a static state as illustrated in FIG. 8E.

5. Vibration Through Mechanical Excitation

Figure 9:
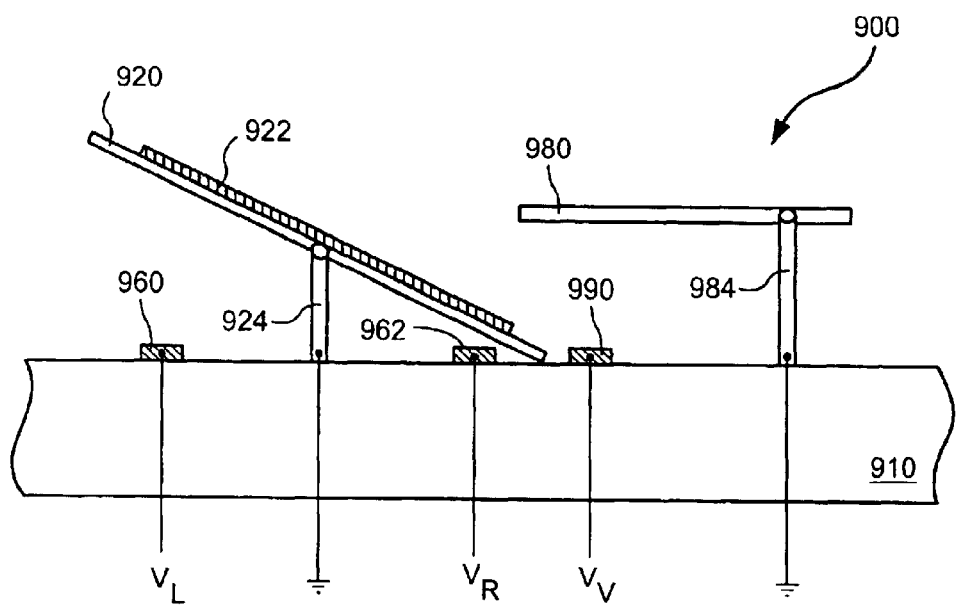
FIG. 9 is a cross-sectional diagram of a tilting structural plate system including a vibrational beam according to embodiments of the present invention.

FIG. 9 illustrates an embodiment of a micromirror system 900 according to the present invention where an external element is used to create localized vibration at a point susceptible to stiction related forces. Micromirror system 900 includes a structural plate 920 deflected to a right tilt position. Structural plate 920 is supported above a base layer 910 by a pivot 924 and includes a micromirror 922 disposed over it. A left actuator 960 and a right actuator 962 are included on either side of pivot 924. When activated, left and right actuators 960, 962 cause structural plate 920 to tilt, or otherwise deflect in the direction of the respective left or right actuator 960, 962.

In addition, micromirror system 900 includes a vibration beam 980 supported above base layer 910 by a pivot 984. Vibration beam 980 can be brought into contact with structural plate 920 through application of a voltage potential, VV, to a vibration actuator 990.

For purposes of discussion, it is assumed that a voltage, VR, was initially applied to right actuator 962 to cause structural plate 920 to assume the right tilt position illustrated in FIG. 9. VR was then removed, but structural plate 920 failed to return to a static horizontal position due to stiction forces incident at the contact between structural plate 920 and base layer 910. To overcome such stiction related forces, vibration beam 980 is brought into repeated contact with structural plate 920 through application of an AC voltage, VV. Such repeated contact results in a vibration local to the right side of structural plate 920, which sufficiently disrupts stiction forces to allow restorative forces to return structural plate 920 to a horizontal static position.

6. Vibrating Multiple Actuators Simultaneously

Localized vibration according to the present invention can include vibrating a number of areas susceptible to stiction related forces simultaneously. Thus, in some embodiments of the present invention, the right side of all structural plates in an array of structural plates may be vibrated simultaneously according to the present invention. In such an embodiment, all of the structural plates are not necessarily being moved from a right tilt position, however, all of the structural plates are nonetheless vibrated. Right actuators associated with each of the structural plates which are to be switched from the right tilt position are all de-energized. Thus, the only forces maintaining the structural plates to be moved from the right tilt position are stiction related forces. Such stiction related forces are, however, sufficiently disrupted by simultaneous localized vibration according to the various embodiments of the present invention. Disrupting the stiction related forces allows the restorative forces associated with each of the individual structural plates to return the respective structural plates to a horizontal static position.

In contrast, right actuators associated with structural plates which are to remain tilted to the right, continue to be activated while the localized vibration is performed. Such localized vibration temporarily vibrates the various structural plates, but, the structural plates remain aligned and in the right tilt position due to the continuous activation of the right actuators. Thus, structural plates which are to remain tilted to the right are largely unaffected by the localized vibration.

Similarly, structural plates which were previously tilted to the left are also unaffected by the localized vibration. As a structural plate which is tilted to the left is not in contact with vibrating elements associated with the right of the structural plate, the localized vibration can be performed without affecting the alignment of structural plates tilted to the left. Thus, localized vibration may be applied to a number of structural plates simultaneously, regardless of whether a particular structural plate is to be switched or not. Such simultaneous application of localized vibration reduces the complexity of wiring and control logic involved in overcoming stiction through localized vibration.

Figure 10:
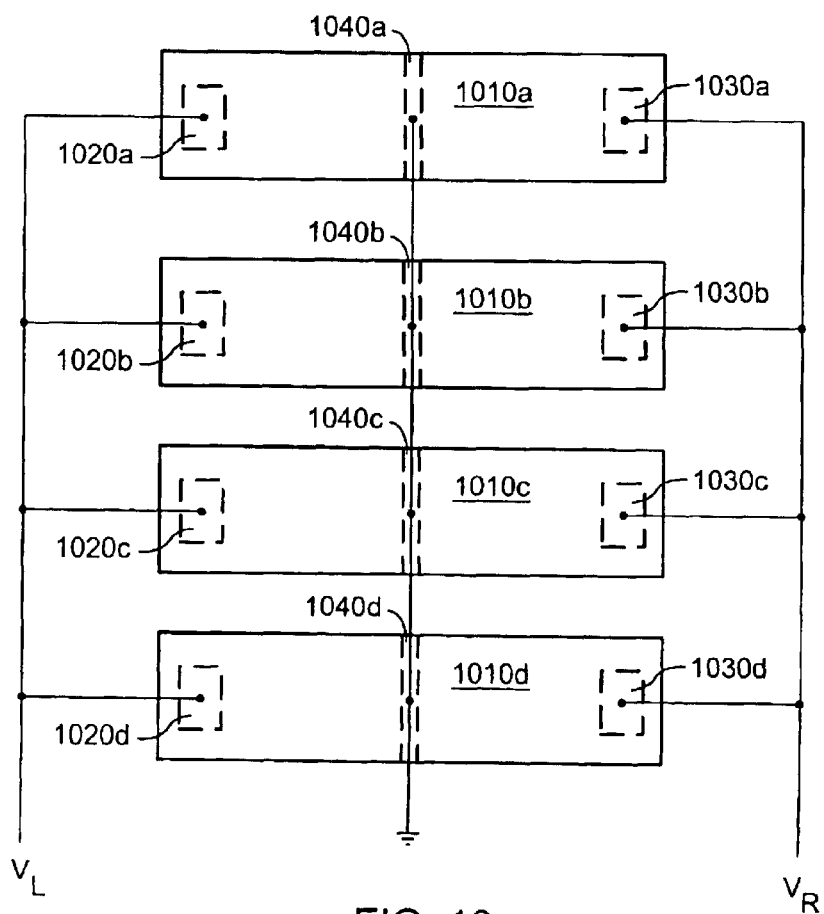
FIG. 10 is a top level diagram of a plurality of vibrational actuators interconnected according to embodiments of the present invention.

FIG. 10 illustrates an embodiment of a structural plate system 1000 where a number of left vibrating actuators 1020 and right vibrating actuators 1030 are connected as groups according to the present invention. More specifically, left vibrating actuators 1020a, 1020b, 1020c, and 1020d are commonly wired to voltage potential VL. Similarly, right vibrating actuators 1030a, 1030b, 1030c, and 1030d are commonly wired to voltage potential VR. Each of the right and left vibrating actuators 1020, 1030, are disposed beneath a corresponding structural plate 1010. Each of structural plates 1010 are disposed above a base layer (not shown) and supported by pivots 1040.

By applying potential VL, each of left vibrating actuators 1020 is vibrated. Similarly, each of right vibrating actuators 1030 are vibrated by application of potential VR. By interconnecting a number of vibrating actuators, stiction can be overcome through localized vibration through the use of minimal wiring and/or control logic. Further, such use of localized vibration can be accomplished without affecting structural plates 1010 which are not to be moved from their existing tilt positions.

7. Fiber-Optics Applications a. Wavelength Router

Tilting micromirrors according to the embodiments described above, and their equivalents, may be used in numerous applications as parts of optical switches, display devices, or signal modulators, among others. One particular application of such tilting micromirrors is as optical switches in a wavelength router such as may be used in fiber-optic telecommunications systems. One such wavelength router is described in detail in the copending, commonly assigned U.S. patent application, filed Nov. 16, 1999 and assigned Ser. No. 09/442,061, entitled "Wavelength Router," which is herein incorporated by reference in its entirety, including the Appendix, for all purposes. The various micromirror embodiments may be used in that wavelength router or may be incorporated into other wavelength routers as optical switches where it is desirable to avoid stiction problems.

Wavelength routing functions may be performed optically with a free-space optical train disposed between the input ports and the output ports, and a routing mechanism. The free-space optical train can include air-spaced elements or can be of generally monolithic construction. The optical train includes a dispersive element such as a diffraction grating, and is configured so that the light from the input port encounters the dispersive element twice before reaching any of the output ports. The routing mechanism includes one or more routing elements and cooperates with the other elements in the optical train to provide optical paths that couple desired subsets of the spectral bands to desired output ports. The routing elements are disposed to intercept the different spectral bands after they have been spatially separated by their first encounter with the dispersive element.

Figure 11A:
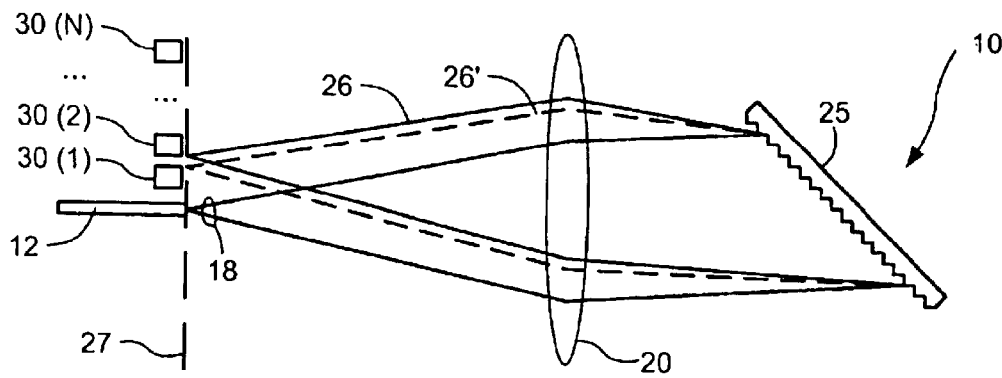
FIGS. 11A, 11B, and 11C are schematic top, side, and end views, respectively, of one embodiment of a wavelength router that uses spherical focusing elements.
Figure 11B:
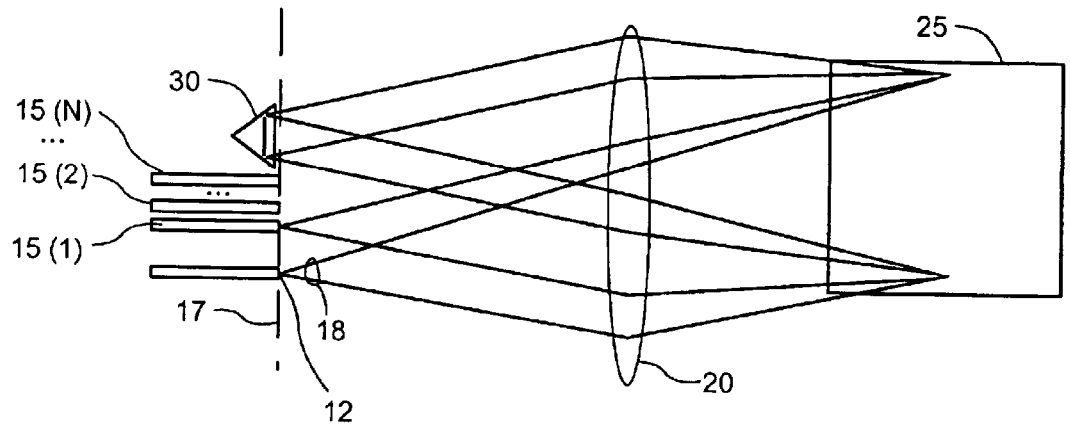
Figure 11C:
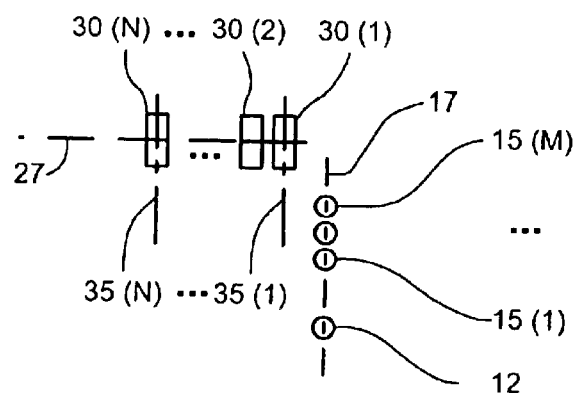

FIGS. 11A, 11B, and 11C are schematic top, side, and end views, respectively, of one embodiment of a wavelength router 10. Its general functionality is to accept light having a plurality N of spectral bands at an input port 12, and to direct subsets of the spectral bands to desired ones of a plurality M of output ports, designated 15(1) . . . 15(M). The output ports are shown in the end view of FIG. 11C as disposed along a line 17 that extends generally perpendicular to the top view of FIG. 11A. Light entering the wavelength router 10 from input port 12 forms a diverging beam 18, which includes the different spectral bands. Beam 18 encounters a lens 20 that collimates the light and directs it to a reflective diffraction grating 25. The grating 25 disperses the light so that collimated beams at different wavelengths are directed at different angles back towards the lens 20.

Two such beams are shown explicitly and denoted 26 and 26', the latter drawn in dashed lines. Since these collimated beams encounter the lens 20 at different angles, they are focused towards different points along a line 27 in a transverse plane extending in the plane of the top view of FIG. 11A. The focused beams encounter respective ones of a plurality of retroreflectors that may be configured according as contactless micromirror optical switches as described above, designated 30(1) . . . 30(N), located near the transverse plane. The beams are directed back, as diverging beams, to the lens 20 where they are collimated, and directed again to the grating 25. On the second encounter with the grating 25, the angular separation between the different beams is removed and they are directed back to the lens 20, which focuses them. The retroreflectors 30 may be configured to send their intercepted beams along a reverse path displaced along respective lines 35(1) . . . 35(N) that extend generally parallel to line 17 in the plane of the side view of FIG. 11B and the end view of FIG. 2C, thereby directing each beam to one or another of output ports 15.

Figure 13:
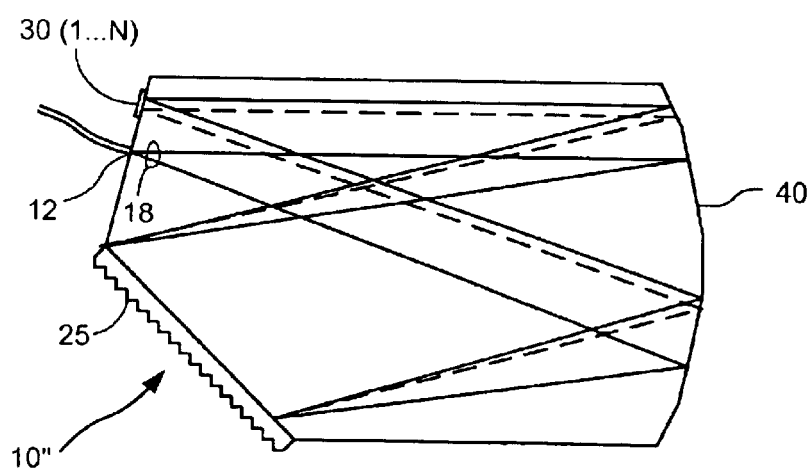
FIG. 13 is a schematic top view of a third embodiment of a wavelength router that uses spherical focusing elements.

Another embodiment of a wavelength router, designated 10', is illustrated with schematic top and side views in FIGS. 13A and 13B, respectively. This embodiment may be considered an unfolded version of the embodiment of FIGS. 11A–11C. Light entering the wavelength router 10' from input port 12 forms diverging beam 18, which includes the different spectral bands. Beam 18 encounters a first lens 20a, which collimates the light and directs it to a transmissive grating 25'. The grating 25' disperses the light so that collimated beams at different wavelengths encounter a second lens 20b, which focuses the beams. The focused beams are reflected by respective ones of plurality of retroreflectors 30, which may also be configured as contactless micromirror optical switches, as diverging beams, back to lens 20b, which collimates them and directs them to grating 25'. On the second encounter, the grating 25' removes the angular separation between the different beams, which are then focused in the plane of output ports 15 by lens 20a.

Figure 12A:
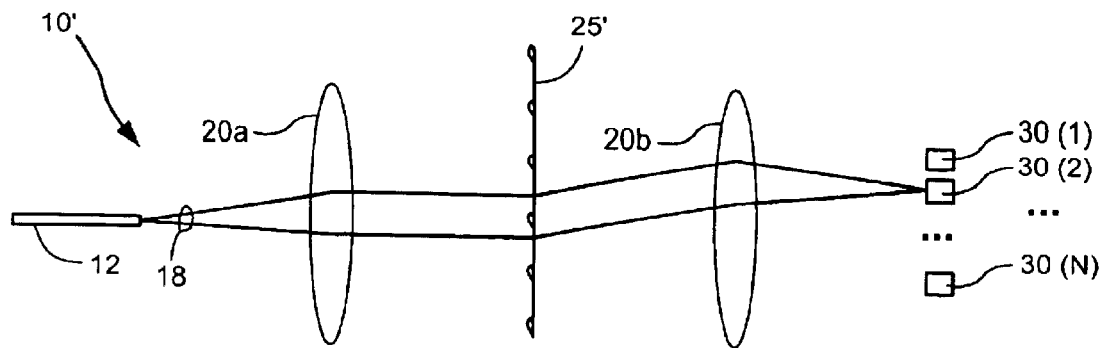
FIGS. 12A and 12B are schematic top and side views, respectively, of a second embodiment of a wavelength router that uses spherical focusing elements.
Figure 12B:
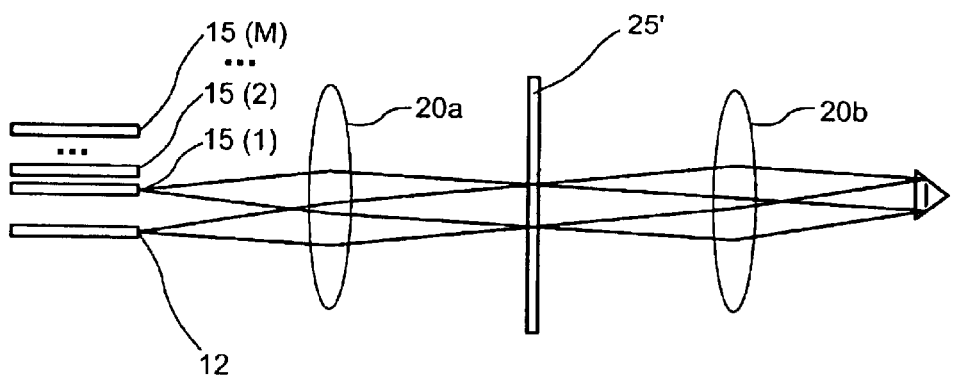

A third embodiment of a wavelength router, designated 10", is illustrated with the schematic top view shown in FIG. 9. This embodiment is a further folded version of the embodiment of FIGS. 11A–11C, shown as a solid glass embodiment that uses a concave reflector 40 in place of lens 20 of FIGS. 11A–11C or lenses 20a and 20b of FIGS. 12A–12B. Light entering the wavelength router 10" from input port 12 forms diverging beam 18, which includes the different spectral bands. Beam 18 encounters concave reflector 40, which collimates the light and directs it to reflective diffraction grating 25, where it is dispersed so that collimated beams at different wavelengths are directed at different angles back towards concave reflector 40. Two such beams are shown explicitly, one in solid lines and one in dashed lines. The beams then encounter retroreflectors 30 and proceed on a return path, encountering concave reflector 40, reflective grating 25', and concave reflector 40, the final encounter with which focuses the beams to the desired output ports. Again, the retroreflectors 30 may be configured as contactless micromirror optical switches.

b. Optical-Switch Retroreflector Implementations

Figure 14A:
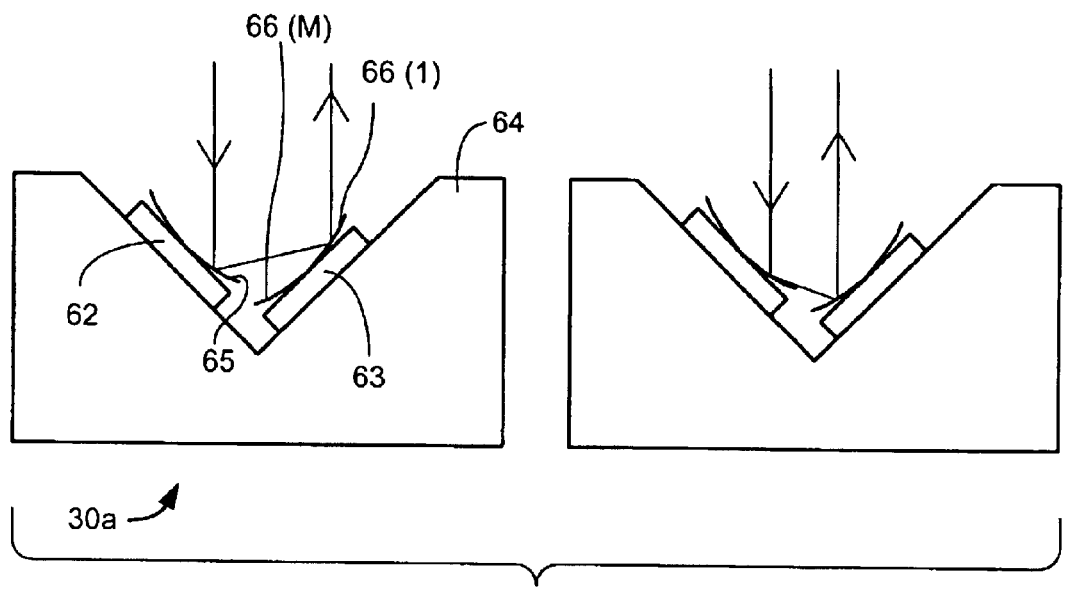
FIGS. 14A and 14B are side and top views of an implementation of a micromirror retroreflector array.
Figure 14B:
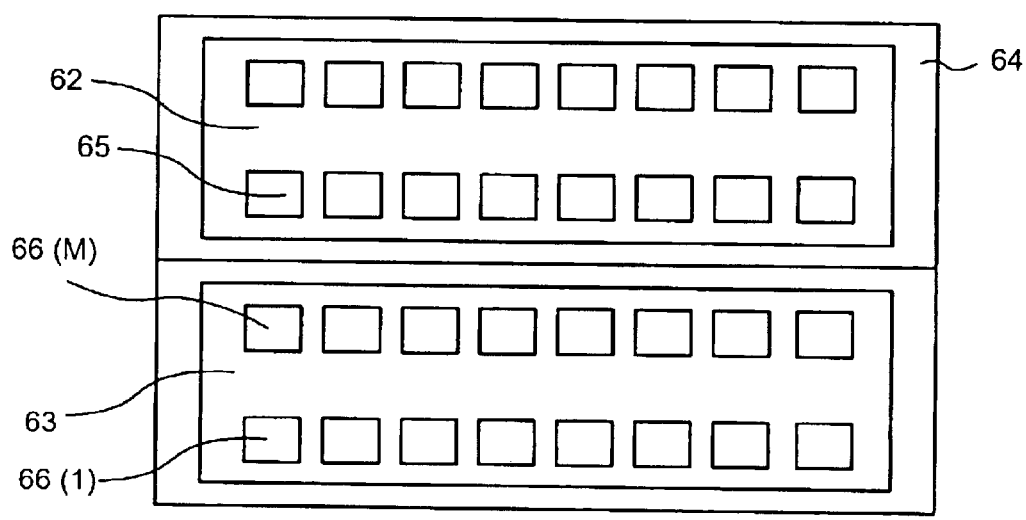

FIG. 14A shows schematically the operation of a retroreflector, designated 30*a*, that uses contactless-micromirror optical switches. FIG. 14B is a top view. A pair of micromirror arrays 62 and 63 is mounted to the sloped faces of a V-block 64. A single micromirror 65 in micromirror array 62 and a row of micromirrors 66(1 . . . M) in micromirror array 63 define a single retroreflector. Micromirror arrays may conveniently be referred to as the input and output micromirror arrays, with the understanding that light paths are reversible. The left portion of FIG. 14A shows micromirror 65 in a first orientation so as to direct the incoming beam to micromirror 66(1), which is oriented 90° with respect to micromirror 65's first orientation to direct the beam back in a direction opposite to the incident direction. The right half of FIG. 14A shows micromirror 65 in a second orientation so as to direct the incident beam to micromirror 66(M). Thus, micromirror 65 is moved to select the output position of the beam, while micromirrors 66(1 . . . M) are fixed during normal operation. Micromirror 65 and the row of micromirrors 66(1 . . . M) can be replicated and displaced in a direction perpendicular to the plane of the figure. While micromirror array 62 need only be one-dimensional, it may be convenient to provide additional micromirrors to provide additional flexibility.

In one embodiment, the micromirror arrays are planar and the V-groove has a dihedral angle of approximately 90° so that the two micromirror arrays face each other at 90°. This angle may be varied for a variety of purposes by a considerable amount, but an angle of 90° facilitates routing the incident beam with relatively small angular displacements of the micromirrors. In certain embodiments, the input micromirror array has at least as many rows of micromirrors as there are input ports (if there are more than one), and as many columns of mirrors as there are wavelengths that are to be selectably directed toward the output micromirror array. Similarly, in some embodiments, the output micromirror array has at least as many rows of micromirrors as there are output ports, and as many columns of mirrors as there are wavelengths that are to be selectably directed to the output ports.

In a system with a magnification factor of one-to-one, the rows of micromirrors in the input array are parallel to each other and the component of the spacing from each other along an axis transverse to the incident beam corresponds to the spacing of the input ports. Similarly, the rows of micromirrors in the output array are parallel to each other and spaced from each other (transversely) by a spacing corresponding to that between the output ports. In a system with a different magnification, the spacing between the rows of mirrors would be adjusted accordingly.

8. Conclusion

The invention has now been described in detail for purposes of clarity and understanding. However, it will be appreciated that certain changes and modifications may be practiced within the scope of the appended claims. For example, additional vibrational structures can be added to provide additional aspects according to the present invention. Additionally, it should be recognized that a variety of functions can be performed using the present invention. For example, a particular structural plate may be switched from a right tilt position to a left tilt position without first coming to rest in a horizontal static position. This can be accomplished through a combination of activation and de-activation of respective left and right actuators. Such a combination of activation will be readily apparent to one of ordinary skill in the art from the preceding detailed description.

Thus, although the invention is described with reference to specific embodiments and figures thereof, the embodiments and figures are merely illustrative, and not limiting of the invention. Rather, the scope of the invention is to be determined solely by the appended claims.

What is claimed is:

1. An electo-mechanical system capable of overcoming stiction forces through localized vibration, the system comprising:

a base layer having a surface;

a device supported above the surface by a pivot, wherein the device is movable along a movement path;

a stop located at a contact position along the movement path, wherein the device contacts the stop at the contact position, and wherein a stiction force between the device and the stop exits at the contact position; and a vibration element operable to cause a vibration at or near the contact position, the vibration element having a vibration actuator, wherein the vibration disrupts the stiction force.

2. The system of claim 1, the system further comprising an device actuator, wherein the device actuator is operable to cause the device to move along the movement path.

3. The system of claim 1, wherein the device is a structural plate, comprising a micro mirror.

4. The system of claim 1, wherein the stop comprises an area of the base layer.

5. The system of claim 4, wherein the vibration element is a mechanical structure operable to repeatedly contact the device at or near the contact point.

6. The system of claim 1, wherein the vibration element comprises a device actuator, wherein the device actuator is operable to cause the device to move along the movement path.

7. The system of claim 1, wherein the vibration element is integral to the device.

8. The system of claim 1, wherein the device is a first device, the pivot is a first pivot, the stop is a first stop, the contact position is a first contact position, the movement path is a first movement path, and the vibration device is a first vibration device, the system further comprising:

at least a second device and a second pivot, wherein the second device is supported above the surface by the second pivot, and wherein the second device is movable along a second movement path;

at least a second stop located at a second contact position along the second movement path, wherein the second device contacts the second stop at the second contact position, and wherein the contact between the second device and the second stop is susceptible to a stiction force;

at least a second vibration element operable to cause a vibration at or near the second contact position, wherein the vibration disrupts the stiction force; and wherein the first and second vibration elements are electrically connected such that the first and second vibration elements are activated together.

9. The system of claim 1, wherein the vibration element comprises an actuator and the device comprises a structural plate and wherein the actuator is activated by a force that creates a movement of the stop relative to the structural plate, wherein the movement is sufficient to overcome stiction forces between the structural plate and the stop.

10. The system of claim 9, wherein activating the actuator with a force causes the stop to displace from a static position to a displaced position, and wherein the movement results from elastic forces associated with the stop which cause the stop to displace from the displaced position to the static position when the actuator is de-activated.

11. The system of claim 10, wherein the movement comprises an oscillation of the stop.

12. The system of claim 11, wherein the oscillation comprises displacement of the stop from the placed position passed the static position to an overshoot position and back to the static position.

13. The system of claim 9, wherein the structural plate is supported above the base layer by a pivot and the stop is disposed over the base layer.

14. The system of claim 13, the system further comprising a micro-mirror disposed on the structural plate.

15. The system of claim 13, wherein the actuator is a first actuator, the system further comprising a second actuator, wherein application of a DC voltage to the second actuator cause the structural plate to displace and contact the stop.

16. The system of claim 1, wherein the stop comprises a mechanical stop, the device comprises a structural plate, and the vibration element comprises an actuator, and wherein application of a DC voltage to the actuator causes the mechanical stop to move relative to the structural plate from a static position to a displaced position, and wherein removal of the DC voltage causes a movement of the mechanical stop from the displaced position to the static position, and wherein the movement is sufficient to overcome stiction forces between the structural plate and the mechanical stop.

17. The system of claim 16, wherein the movement comprises an oscillation of the mechanical stop.

18. The system of claim 17, wherein the oscillation comprises displacement of the mechanical stop from the displaced position passed the static position to an overshoot position and back to the static position.

19. The system of claim 16, wherein the structural plate is supported above base layer by a pivot and the mechanical stop is disposed over the base layer.

20. The system of claim 19, wherein the actuator is a first actuator, the system further comprising a second actuator, wherein application of a force to the second actuator causes the structural plate to deflect into contact with the mechanical stop.

21. The system of claim 16, wherein the system comprises an optical routing apparatus comprising a moveable micromirror.

22. The system of claim 1, wherein the vibration element comprises an actuator and the device comprises a structural plate, and wherein the actuator is activated by an alternating force that creates an oscillating movement of the stop relative to the structural plate, wherein the oscillating movement is sufficient to overcome stiction forces between the structural plate and the stop.

23. The system of claim 22, wherein the alternating force is an AC voltage or a pulsed DC voltage.

24. The system of claim 22, wherein activating the actuator with an alternating force causes the stop to displace to a displaced position when the alternating force is at a first potential, and wherein an elastic force associated with the stop causes the stop to displace toward a static position when the alternating force is at a second potential.

25. The system of claim 24, wherein the oscillating movement results from displacing the stop to the displaced position and returning the stop toward the static position.

26. The system of claim 25, wherein the oscillating movement oscillates at a frequency at or about the frequency of the alternating force.

27. The system of claim 22, wherein the structural plate is supported above the base layer by a pivot and the stop is disposed over the base layer.

28. The system of claim 27, wherein the actuator is a first actuator, the system further comprising a second actuator, wherein application of a voltage to the second actuator cause the structural plate to displace and contact the stop.

* * * * *